United States Patent
Zhou et al.

(10) Patent No.: US 11,495,470 B1
(45) Date of Patent: Nov. 8, 2022

(54) METHOD OF ENHANCING ETCHING SELECTIVITY USING A PULSED PLASMA

(71) Applicant: Applied Materials, Inc., Santa Clara, CA (US)

(72) Inventors: Hailong Zhou, San Jose, CA (US); Sean Kang, Santa Clara, CA (US); Kenji Takeshita, Santa Clara, CA (US); Rajinder Dhindsa, Pleasanton, CA (US); Taehwan Lee, Santa Clara, CA (US); Iljo Kwak, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/244,873

(22) Filed: Apr. 29, 2021

Related U.S. Application Data

(60) Provisional application No. 63/175,759, filed on Apr. 16, 2021.

(51) Int. Cl.
*H01L 21/311* (2006.01)

(52) U.S. Cl.
CPC .. *H01L 21/31116* (2013.01); *H01L 21/31144* (2013.01)

(58) Field of Classification Search
None
See application file for complete search history.

(56) References Cited

U.S. PATENT DOCUMENTS

| 4,070,589 A | 1/1978 | Martinkovic |
| 4,340,462 A | 7/1982 | Koch |

(Continued)

FOREIGN PATENT DOCUMENTS

| CN | 101707186 B | 2/2012 |
| CN | 106206234 A | 12/2016 |

(Continued)

OTHER PUBLICATIONS

Wang, S.B., et al.—"Control of ion energy distribution at subsliales during plasma processing," Journal of Applied Physics, vol. 88, No. 2, Jul. 15, 2000, pp. 643-646.

(Continued)

*Primary Examiner* — Allan W. Olsen
(74) *Attorney, Agent, or Firm* — Patterson + Sheridan, LLP

(57) ABSTRACT

Embodiments of this disclosure include a method of processing a substrate that includes etching a first dielectric material formed on a substrate that is disposed on a substrate supporting surface of a substrate support assembly disposed within a processing region of a plasma processing chamber. The etching process may include delivering a process gas to the processing region, wherein the process gas comprises a first fluorocarbon containing gas and a first process gas, delivering, by use of a radio frequency generator, a radio frequency signal to a first electrode to form a plasma in the processing region, and establishing, by use of a first pulsed-voltage waveform generator, a first pulsed voltage waveform at a biasing electrode disposed within the substrate support assembly. The first pulsed voltage waveform comprises a series of repeating pulsed waveform cycles that each include a first portion that occurs during a first time interval, a second portion that occurs during a second time interval, and a peak-to-peak voltage. The pulsed voltage waveform is substantially constant during at least a portion of the second time interval.

17 Claims, 13 Drawing Sheets

(56) References Cited

U.S. PATENT DOCUMENTS

| | | |
|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |

(56) References Cited

U.S. PATENT DOCUMENTS

| | | |
|---|---|---|
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 * | 3/2016 | Brouk ............... C23C 14/345 |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |

(56) References Cited

U.S. PATENT DOCUMENTS

| | | | |
|---|---|---|---|
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,332,906 B2 * | 6/2019 | Narumiya ......... H01L 27/11582 |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |

(56) References Cited

U.S. PATENT DOCUMENTS

| | | |
|---|---|---|
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0070665 A1* | 3/2011 | Chen ............... H01J 37/32935 438/5 |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Kamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0221478 A1 | 8/2015 | Himori et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0278864 A1 | 9/2017 | Hu et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |

(56) References Cited

U.S. PATENT DOCUMENTS

| | | |
|---|---|---|
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157040 A1* | 5/2019 | Fairbairn .......... H01J 37/32174 |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0075627 A1 | 3/2020 | Ahn et al. |
| 2020/0090905 A1 | 3/2020 | Brouk et al. |
| 2020/0105767 A1* | 4/2020 | Huang .............. H01L 21/32139 |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0335305 A1* | 10/2020 | Long ................. H01J 37/32174 |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0288582 A1 | 9/2021 | Ziemba et al. |

FOREIGN PATENT DOCUMENTS

| | | |
|---|---|---|
| CN | 104752134 B | 2/2017 |
| CN | 111512439 A | 8/2020 |
| JP | H08236602 A | 9/1996 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 2014112644 A | 6/2014 |
| JP | 6741461 B2 | 8/2020 |
| KR | 100757347 B1 | 9/2007 |
| KR | 20160042429 A | 4/2016 |
| WO | 2000017920 A1 | 3/2000 |
| WO | 2002059954 A1 | 8/2002 |
| WO | 2008050619 A1 | 5/2008 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2015073921 A8 | 5/2016 |
| WO | 2016131061 A1 | 8/2016 |
| WO | 2017172536 A1 | 10/2017 |
| WO | 2018048925 A1 | 3/2018 |
| WO | 2018111751 | 6/2018 |
| WO | 2018170010 A1 | 9/2018 |
| WO | 2019036587 A1 | 2/2019 |
| WO | 2019040949 A1 | 2/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019245729 A1 | 12/2019 |
| WO | 2020004048 A1 | 1/2020 |
| WO | 2020017328 A1 | 1/2020 |
| WO | 2020051064 A1 | 3/2020 |
| WO | 2020121819 A1 | 6/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Richard Barnett et al. A New Plasma Source for Next Generation MEMS Deep Si Etching: Minimal Tilt, Improved Profile Uniformity and Higher Etch Rates, SPP Process Technology Systems. 2010.

(56) References Cited

OTHER PUBLICATIONS

Yiting Zhang et al. "Investigation of feature orientation and consequences of ion tilting during plasma etching with a three-dimensional feature profile simulator", Nov. 22, 2016.
Michael A. Lieberman, "Principles of Plasma Discharges and Material Processing", A Wiley Interscience Publication. 1994.
Zhuoxing Luo, B.S., M.S, "RF Plasma Etching With a DC Bias" A Dissertation in Physics. Dec. 1994.
Dr. Steve Sirard, "Introduction to Plasma Etching", Lam Research Corporation. 64 pages.
Eagle Harbor Technologies presentation by Dr. Kenneth E. Miller— "The EHT Integrated Power Module (IPM): An IGBT-Based, High Current, Ultra-Fast, Modular, Programmable Power Supply Unit," Jun. 2013, 21 pages.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—High Gain and Frequency Ultra-Stable Integrators for Long Pulse and/or High Current Applications, 2018, 1 page.
Eagle Harbor Technologies webpage—"In Situ Testing of EHT Integrators on a Tokamak," 2015, 1 page.
Eagle Harbor Technologies webpage—"Long-Pulse Integrator Testing with DIII-D Magnetic Diagnostics," 2016, 1 page.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Prager, J R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.
Semiconductor Components Industries, LLC (SCILLC)—"Switch-Mode Power Supply" Reference Manual, SMPSRM/D, Rev. 4, Apr. 2014, ON Semiconductor, 73 pages.
Sunstone Circuits—"Eagle Harbor Tech Case Study," date unknown, 4 pages.
Michael A. Lieberman, "A short course of the principles of plasma discharges and materials processing", Department of Electrical Engineering and Computer Sciences University of California, Berkeley, CA 94720.
Chang, Bingdong, "Oblique angled plasma etching for 3D silicon structures with wiggling geometries" 31(8), [085301]. https://doi.org/10.1088/1361-6528/ab53fb. DTU Library. 2019.
Zhen-hua Bi et al., A brief review of dual-frequency capacitively coupled discharges, Current Applied Physics, vol. 11, Issue 5, Supplement, 2011, pp. S2-S8.
Electrical 4 U webpage—"Clamping Circuit," Aug. 29, 2018, 1 page.
Yung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
S.B. Wang et al. "Ion Bombardment Energy and SiO 2/Si Fluorocarbon Plasma Etch Selectivity", Journal of Vacuum Science & Technology A 19, 2425 (2001).
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
Eagle Harbor Technologies presentation by Dr. Kenneth E. Miller— "The EHT Long Pulse Integrator Program," ITPA Diagnostic Meeting, General Atomics, Jun. 4-7, 2013, 18 pages.
International Search Report/Written Opinion issued to PCT/US2022/020957 dated Jul. 11, 2022.

\* cited by examiner

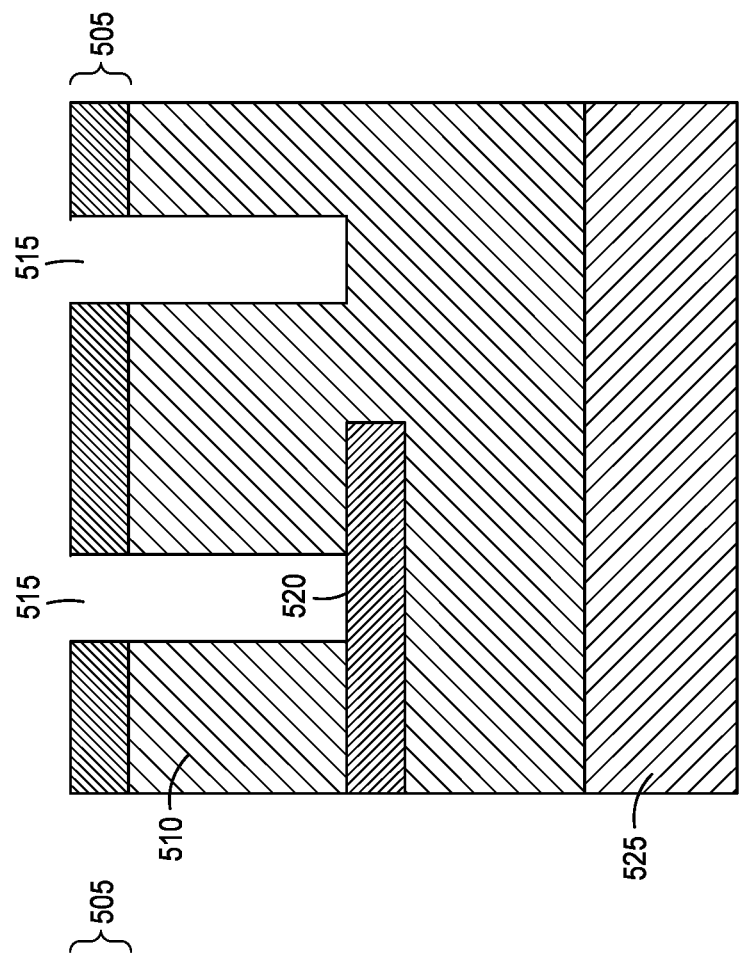
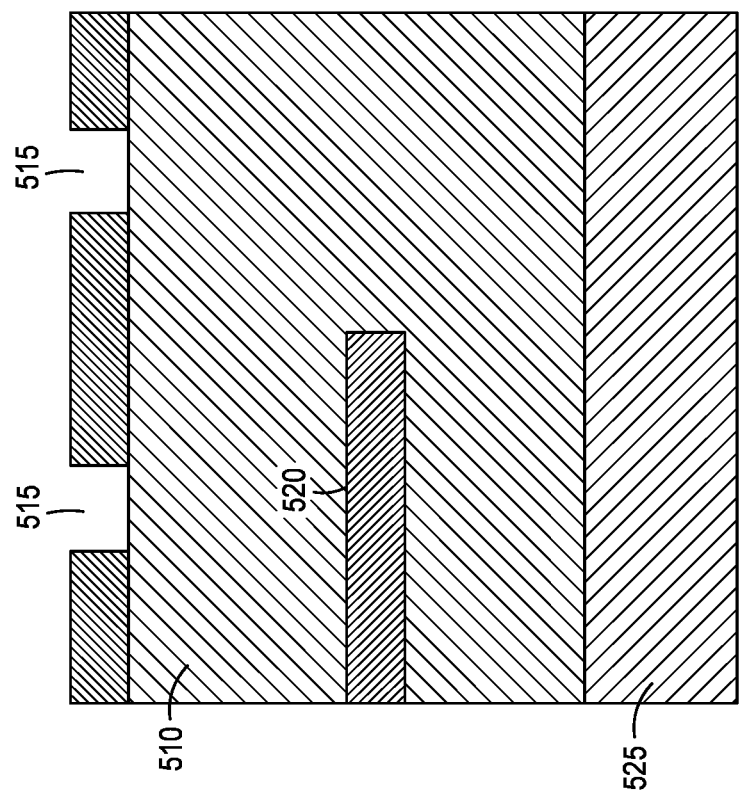
FIG. 6B
FIG. 6A

METHOD OF ENHANCING ETCHING SELECTIVITY USING A PULSED PLASMA

CROSS-REFERENCE TO RELATED APPLICATIONS

This application claims the benefit of U.S. provisional patent application Ser. No. 63/175,759, filed Apr. 16, 2021, which is herein incorporated by reference.

BACKGROUND

Field

Embodiments described herein generally relate to semiconductor device manufacturing hardware and processes, and more specifically to an apparatus and methods of processing a substrate in a plasma processing chamber.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in an RIE processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a "power electrode" (e.g., a biasing electrode), such as a metal plate positioned adjacent to an "electrostatic chuck" (ESC) assembly, more commonly referred to as the "cathode". The power electrode can be capacitively coupled to the plasma of a processing system through a thick layer of dielectric material (e.g., ceramic material), which is a part of the ESC assembly. In a capacitively coupled gas discharge, the plasma is created by using a radio frequency (RF) generator that is coupled to an RF electrode through an RF matching network ("RF match") that tunes the apparent load to 50Ω to minimize the reflected power and maximize the power delivery efficiency. The application of RF voltage to the power electrode causes an electron-repelling plasma sheath (also referred to as the "cathode sheath") to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropy. More specifically, ion directionality, the feature profile, and etch selectivity to the mask and the stop-layer are controlled by the Ion Energy Distribution Function (IEDF). In plasmas with RF bias, the IEDF typically has two non-discrete peaks, one at a low energy and one at a high energy, and an ion population that has a range of energies that extend between the two peaks. The presence of the ion population in-between the two peaks of the IEDF is reflective of the fact that the voltage drop between the substrate and the plasma oscillates at the RF bias frequency. When a lower frequency RF bias generator is used to achieve higher self-bias voltages, the difference in energy between these two peaks can be significant; and because the etch profile due to the ions at low energy peak is more isotropic, this could potentially lead to bowing of the etched feature walls. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch. As feature sizes continue to diminish and the aspect ratio increases, while feature profile control requirements become more stringent, it becomes more desirable to have a well-controlled IEDF at the substrate surface during processing.

Other conventional plasma processes and processing chamber designs have also found that delivering multiple different RF frequencies to one or more of the electrodes in a plasma processing chamber can be used to control various plasma properties, such as plasma density, ion energy, and/or plasma chemistry. However, it has been found that the delivery of multiple conventional sinusoidal waveforms from two or more RF sources, which are each configured to provide different RF frequencies, is unable to adequately or desirably control the sheath properties and can lead to undesirable arcing problems. Moreover, due to direct or capacitive coupling between the RF sources during processing, each RF source may induce an RF current that is provided to the output of the other connected RF source(s) (e.g., often referred to as the "cross-talk"), resulting in the power being diverted away from the intended load (plasma), as well as possibly causing damage to each of the RF sources.

Recently, high density storage devices have been developed that include a three-dimensional (3D) stacked memory structure. For example, a 3D NAND stacked memory device can be formed from an array of alternating vertical stacks of dielectric materials and electrically conductive layers (e.g., tungsten containing layers). Memory openings are formed and extend vertically through the dielectric material containing layers in the alternating stack to expose portions of the conductive layers, and thus have varying depths within the alternating stack structure. The memory openings are eventually filled with a conductive material to form a connection with the exposed portion of each conductive layer in each layer of the alternating stack. The electrically conductive layers within the alternating stack can function as word lines of a 3D NAND stacked memory device, and bit lines overlying an array of memory stack structures can be connected to drain-side ends of the semiconductor channels. However, it is desirable when forming the memory openings, which extend to different depths within the alternating stack, in a single etching step without over etching portions of the layers of the alternating stack at the shallowest depths versus the layers formed at the deepest depths. Therefore, there is a need for an etch process that can selectivity etch the dielectric portions of the alternating stack and stop on the conductive layers, such that all of the memory openings can be formed to all of the layers within alternating stack without over-etching the exposed portions of the various conductive features during the etching process.

Accordingly, there is a need in the art for novel, robust and reliable plasma processing and biasing methods that enable maintaining a nearly constant sheath voltage, and thus create a desirable and repeatable IEDF at the surface of the substrate to enable a precise control over the shape of IEDF and, in some cases, the etch profile of the features formed in the surface of the substrate. There is also a need for a system, device(s) and methods that solve the problems described above.

SUMMARY

The present disclosure generally includes a method of processing a substrate in a plasma processing chamber that includes etching a first dielectric material formed on a substrate that is disposed on a substrate supporting surface of a substrate support assembly disposed within a processing region of the plasma processing chamber. The process of etching the first dielectric material includes delivering a process gas to the processing region of the plasma processing chamber, wherein the process gas comprises a first fluorocarbon containing gas and a first process gas, delivering, by use of a radio frequency generator, a radio frequency signal to a first electrode disposed within the plasma processing chamber to form a plasma in the processing region, and establishing, by use of a first pulsed-voltage waveform generator, a first pulsed voltage waveform at a biasing electrode disposed within the substrate support assembly, wherein the first pulsed voltage waveform comprises a series of repeating pulsed waveform cycles. Each pulsed waveform cycle includes a first portion that occurs during a first time interval and a second portion that occurs during a second time interval, wherein the second time interval is larger than the first time interval, and a peak-to-peak voltage. The pulsed voltage waveform is substantially constant during at least a portion of the second time interval.

Embodiments of the present disclosure may further provide a method of processing a substrate in a plasma processing chamber that includes etching a first dielectric material formed on a substrate that is disposed on a substrate supporting surface of a substrate support assembly disposed within a processing region of the plasma processing chamber. The process of etching the first dielectric material includes delivering a process gas to the processing region of the plasma processing chamber, wherein the process gas comprises a first fluorocarbon containing gas and a first process gas. The first fluorocarbon-containing gas comprises at least one of $C_4F_6$ or $C_3F_6$, and the first process gas comprises at least one of $N_2$, Kr, and $O_2$. The process of etching the first dielectric material also includes delivering, by use of a radio frequency generator, a radio frequency signal to a first electrode disposed within the plasma processing chamber to form a plasma in the processing region, and establishing, by use of a first pulsed-voltage waveform generator, a first pulsed voltage waveform at a biasing electrode disposed within the substrate support assembly, wherein the first pulsed voltage waveform comprises a series of repeating pulsed waveform cycles. Each pulsed waveform cycle includes a first portion that occurs during a first time interval and a second portion that occurs during a second time interval, wherein the second time interval is larger than the first time interval, and a peak-to-peak voltage. The first time interval can be between about 200 ns and about 400 ns, and the first time interval can be less than about 20% of a cycle of the series of repeating cycles. The pulsed voltage waveform within each pulsed waveform cycle can have a peak-to-peak voltage that is between about 5 kV and 20 kV. The pulsed voltage waveform is substantially constant during at least a portion of the second time interval.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 6A-6C illustrate a diagram of the plasma etching process on a substrate, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
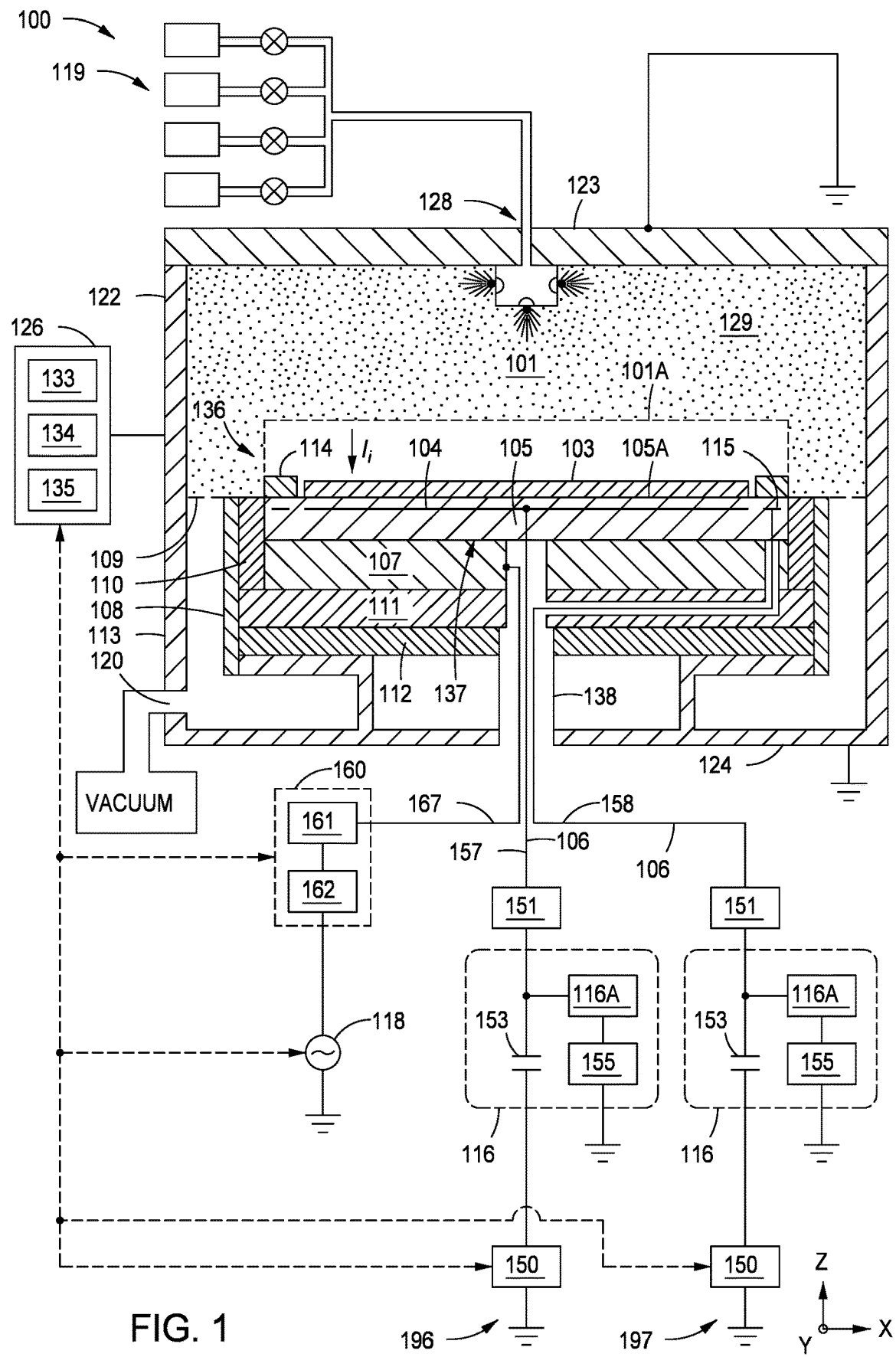
FIG. 1 is a schematic cross-sectional view of a processing chamber configured to practice methods described herein, according to one embodiment.

Embodiments of the disclosure provided herein include an apparatus and method for the plasma processing of a substrate in a processing chamber. More specifically, embodiments of this disclosure describe a process for enhancing selectivity of etching dielectric layers relative to one or more inorganic substances using a pulsed plasma ion etching process. Embodiments of the present disclosure involve an apparatus that is configured to provide a radio frequency (RF) generated RF waveform from an RF generator to one or more electrodes within a processing chamber and a pulsed-voltage (PV) waveform delivered from one or more pulsed-voltage (PV) generators to the one or more electrodes within the processing chamber.

In general, the generated RF waveform is configured to establish and maintain a plasma within the processing chamber, and the delivered PV waveform(s) are configured to control the sheath voltage across the surface of a substrate during portions of the plasma process and thus create a desirable ion energy distribution function (IEDF) at the surface of the substrate during one or more plasma processing steps performed within the processing chamber. The plasma process(es) disclosed herein can be used to control the interaction of the plasma with a surface of a substrate during processing. In some configurations, the plasma process(es) disclosed herein are used to control the profile of features formed in the surface of the substrate during processing. In some embodiments, the pulsed voltage waveform is established by a PV generator that is electrically coupled to a biasing electrode disposed within a substrate support assembly disposed within a plasma processing chamber.

Generally, semiconductor device fabrication processes can include logic and memory fabrication processes, such as the fabrication of flash memory. As devices shrink, structures for fabricating efficient and multiple memory cells are used to maximize density of memory cells in a memory device. Three-dimension (3D) NAND technology addresses challenges with two-dimensional (2D) NAND technology and stacking memory cells vertically in layers.

Plasma etching processes involved in the fabrication of 3D NAND devices are becoming increasingly challenging. Specifically, the staircase contact etch in 3D NAND technology provides access to cells at the bottom of the NAND stack thereby allowing the deposition of conductive material (e.g., tungsten) to form word-lines that allow access to the cell control gates from the outside peripheral circuitry. Staircase contact etching creates challenges for etching, especially for high aspect ratio features ranging in aspect from 20:1 to 40:1. Etching through high aspect ratio conductive layers intensifies the demands on the etching process, which must be capable of forming openings in layers that are striation free, distortion free, and free of line bending, faceting, and feature clogging. Other than these demands, the priority of the staircase contact etch application is combining simultaneous multi-level etching at aspect ratios ranging from 20:1 to more than 40:1 with high selectively to assure that there is negligible loss of the underlying conductive contact materials.

Accordingly, pulse voltage technology can enable methods of precisely controlling the plasma ion density and ion energy during plasma processing. It is believed that the precise control of the plasma ion density and ion energy, in combination with the use of a desirable dry etch chemistries, can be used to cause an increase in etch selectivity and improve etch process result. Moreover, by use of one or more of the methods described herein, etch selectivity and improved etch process results can be further achieved by the controlled formation of a fluorocarbon-based polymer layer on the exposed conductive materials surfaces during the etching process.

FIG. 1 is a schematic cross-sectional view of a processing chamber configured to practice methods described herein. During some semiconductor plasma processes, ions are purposely accelerated towards the substrate by the voltage drop in an electron-repelling sheath that forms over the substrate placed on top of a substrate-support assembly 136 (FIG. 1). While not intending to be limiting as to the scope of the disclosure provided herein, the substrate support assembly 136 is often referred to herein as the "cathode assembly" or "cathode". In some embodiments, the substrate support assembly 136 includes a substrate support 105 and a support base 107. The substrate support 105 can include an electrostatic chuck (ESC) assembly that is configured to chuck (e.g., retain) a substrate on a substrate receiving surface 105A.

In some embodiments of the disclosure provided herein, a processing chamber is configured to provide a capacitively coupled gas discharge, such that a plasma is created by use of an RF generator assembly that includes an RF generator that is coupled to an RF electrode through an RF matching network ("RF match"). The RF matching network is configured to tune the apparent load to 50Ω to minimize the reflected power and maximize the power delivery efficiency. In some embodiments, the RF electrode includes a metal plate that is positioned parallel to the plasma-facing surface of the substrate.

Additionally, during the plasma processing methods disclosed herein, an ion-accelerating cathode sheath is generally formed during plasma processing by use of a pulsed-voltage (PV) generator that is configured to establish a pulsed-voltage waveform at one or more biasing electrodes 104 (FIG. 1) disposed within the substrate support assembly 136. In some embodiments, the one or more biasing electrodes 104 include a chucking electrode that is separated from the substrate by a thin layer of a dielectric material formed within the substrate support assembly 136 (e.g., electrostatic chuck (ESC) assembly) and optionally an edge control electrode that is disposed within or below an edge ring 114 that surrounds a substrate 103 when the substrate 103 is disposed on the substrate supporting surface 105A of the substrate support assembly 136. As will be discussed further below, this PV waveform can be configured to cause a nearly constant sheath voltage (e.g., a difference between the plasma potential and the substrate potential) to be formed for a sizable portion of the PV waveform's pulse period, which corresponds to a single (narrow) peak containing ion energy distribution function (IEDF) of the ions reaching the substrate during this part of the pulse period, which is also referred to herein as the "ion-current phase".

Plasma Processing Chamber Hardware Examples

Figure 3A:
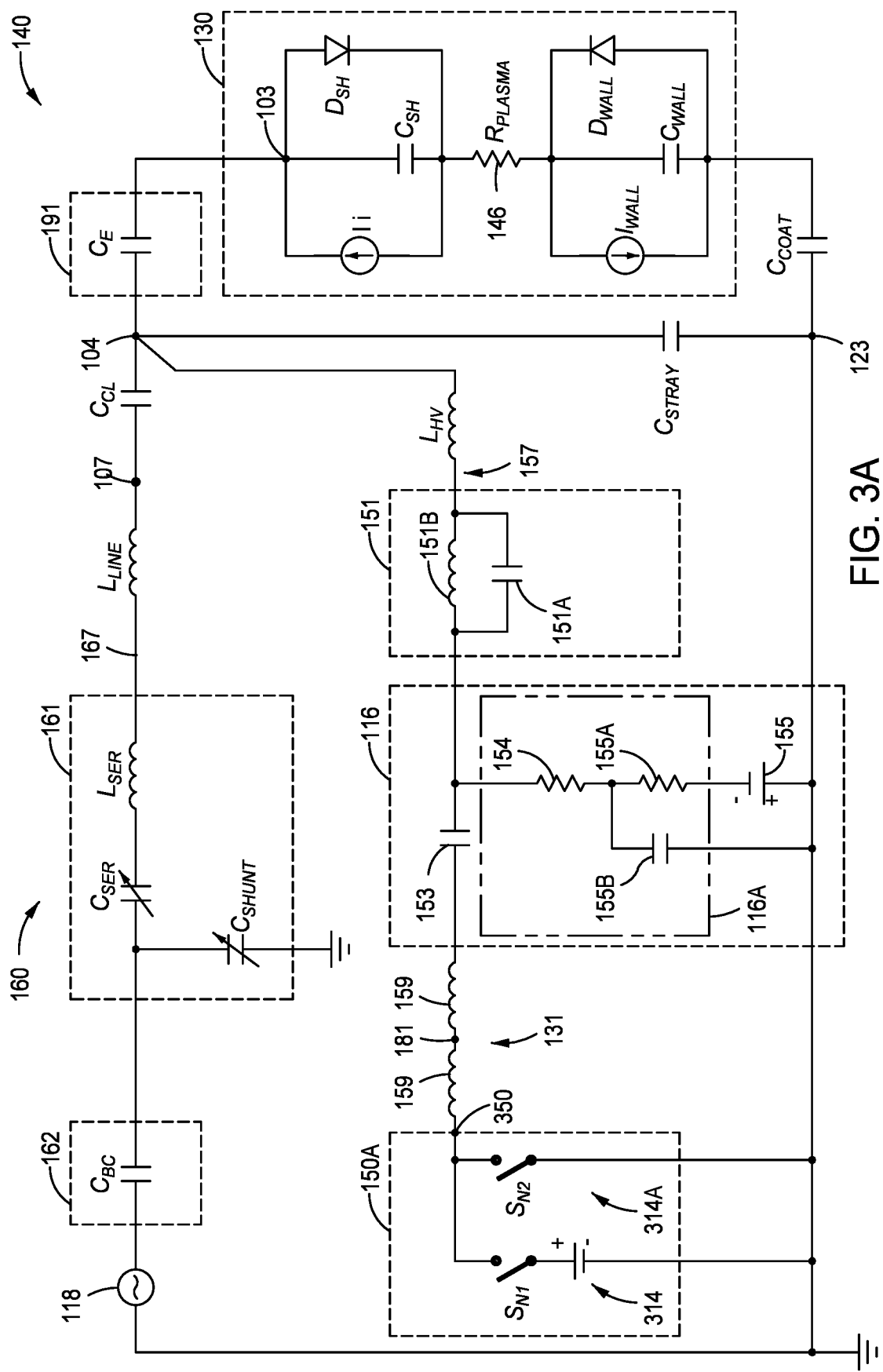
FIG. 3A is a functionally equivalent circuit diagram of a negative pulse biasing scheme that can be performed in the process chamber illustrated in FIG. 1, according to one embodiment.
Figure 3B:
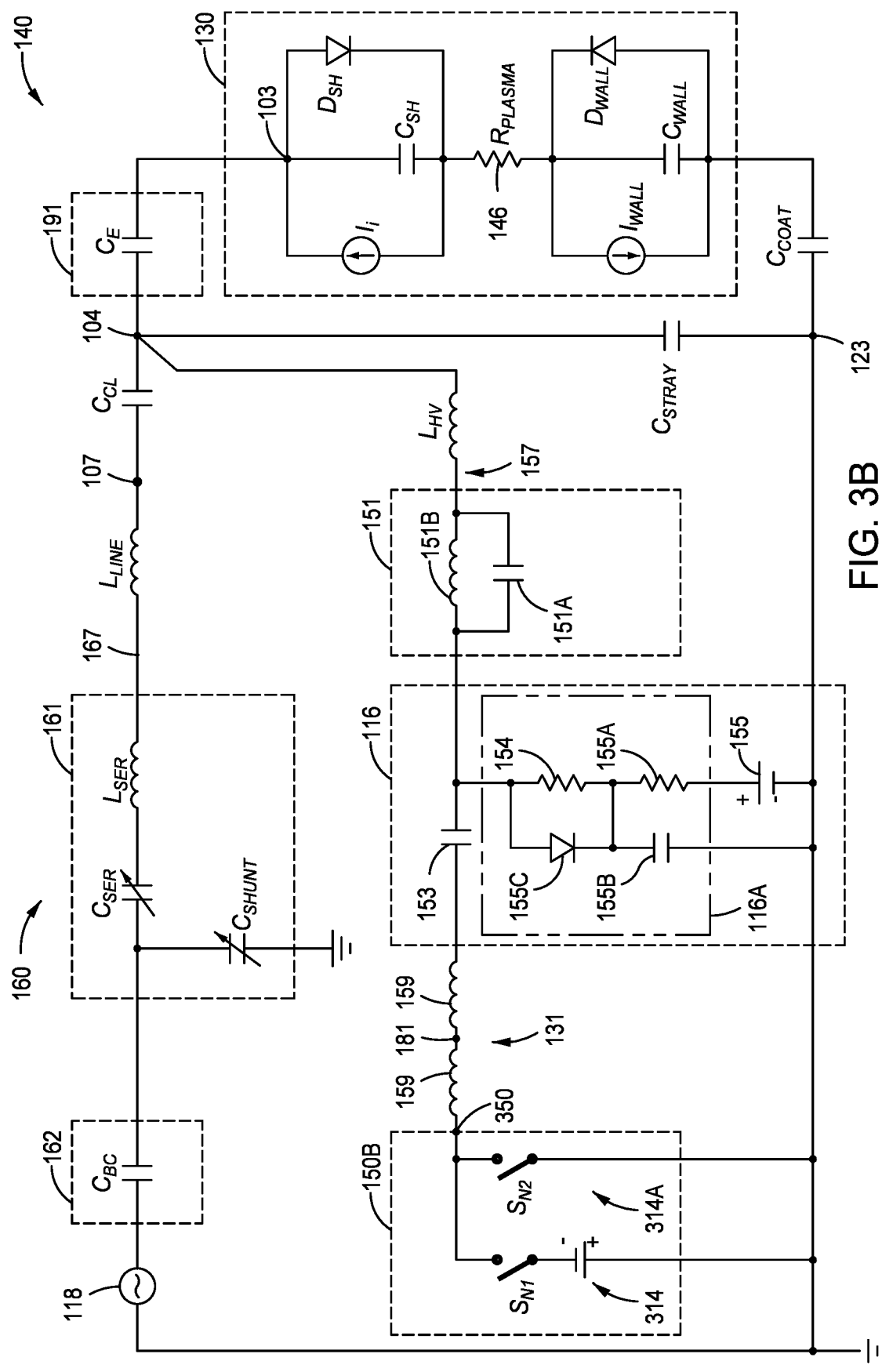
FIG. 3B is a functionally equivalent circuit diagram of a positive pulse biasing scheme that can be performed in the process chamber illustrated in FIG. 1, according to one embodiment.

FIG. 1 is a schematic cross-sectional view of a processing chamber 100, in which a complex load 130 (FIGS. 3A-3B) is formed during plasma processing. FIGS. 3A-3B are each examples of a simplified electrical circuit 140 of a pulsed voltage and RF biasing scheme that can be performed using the components found in processing chamber 100. The processing chamber 100 is configured to practice one or more of the biasing schemes proposed herein, according to one or more embodiments. In one embodiment, the processing chamber is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber. In some embodiments, the plasma source is a capacitively coupled plasma (CCP) source, which includes an electrode (e.g., chamber lid 123) disposed in the processing volume facing the substrate support assembly 136. As illustrated in FIG. 1, an opposing electrode, such as the chamber lid 123, which is positioned opposite to the substrate support assembly 136, is electrically coupled to ground. However, in other alternate embodiments, the opposing electrode is electrically coupled to an RF generator. In yet other embodiments, the processing chamber may alternately, or additionally, include an inductively coupled plasma (ICP) source electrically coupled to a radio frequency (RF) power supply.

The processing chamber 100 also includes a chamber body 113 that includes the chamber lid 123, one or more sidewalls 122, and a chamber base 124, which define a processing volume 129. The one or more sidewalls 122 and chamber base 124 generally include materials that are sized and shaped to form the structural support for the elements of the processing chamber 100, and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel. A gas inlet 128 disposed through the chamber lid 123 is used to provide one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103. Herein, the substrate 103 is transferred to and from a substrate receiving surface 105A of an ESC substrate support 105 using a lift pin system (not shown).

In some embodiments, an RF generator assembly 160 is configured to deliver RF power to the support base 107 disposed proximate to the ESC substrate support 105, and within the substrate support assembly 136. The RF power delivered to the support base 107 is configured to ignite and maintain a processing plasma 101 formed by use of processing gases disposed within the processing volume 129. In some embodiments, the support base 107 is an RF electrode that is electrically coupled to an RF generator 118 via an RF matching circuit 161 and a first filter assembly 162, which are both disposed within the RF generator assembly 160. In some embodiments, the plasma generator assembly 160 and RF generator 118 are used to ignite and maintain a processing plasma 101 using the processing gases disposed in the processing volume 129 and fields generated by the RF power provided to the support base 107 by the RF generator 118. The processing volume 129 is fluidly coupled to one or more dedicated vacuum pumps, through a vacuum outlet 120, which maintain the processing volume 129 at sub-atmospheric pressure conditions and evacuate processing and/or other gases, therefrom. A substrate support assembly 136, disposed in the processing volume 129, is disposed on a support shaft 138 that is grounded and extends through the chamber base 124. However, in some embodiments, the RF generator assembly 160 is configured to deliver RF power to the biasing electrode 104 disposed in the substrate support 105 versus the support base 107.

The substrate support assembly 136, as briefly discussed above, generally includes a substrate support 105 (e.g., ESC substrate support) and support base 107. In some embodiments, the substrate support assembly 136 can additionally include an insulator plate 111 and a ground plate 112, as is discussed further below. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion resistant thermally conductive material, such as a corrosion resistant metal, for example aluminum, an aluminum alloy, or stainless steel and is coupled to the substrate support with an adhesive or by mechanical means.

The support base 107 is electrically isolated from the chamber base 124 by the insulator plate 111, and the ground plate 112 is interposed between the insulator plate 111 and the chamber base 124. In some embodiments, the processing chamber 100 further includes a quartz pipe 110, or collar, that at least partially circumscribes portions of the substrate support assembly 136 to prevent corrosion of the ESC substrate support 105 and, or, the support base 107 from contact with corrosive processing gases or plasma, cleaning gases or plasma, or byproducts thereof. Typically, the quartz pipe 110, the insulator plate 111, and the ground plate 112 are circumscribed by a liner 108. Herein, a plasma screen 109 approximately coplanar with the substrate receiving surface of the ESC substrate support 105 prevents plasma from forming in a volume between the liner 108 and the one or more sidewalls 122.

The substrate support 105 is typically formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes a biasing electrode 104 embedded in the dielectric material thereof. In one configuration, the biasing electrode 104 is a chucking pole used to secure (chuck) the substrate 103 to a substrate receiving surface 105A of the substrate support 105, also referred to herein as an ESC substrate support, and to bias the substrate 103 with respect to the processing plasma 101 using one or more of the pulsed-voltage biasing schemes described herein. Typically, the biasing electrode 104 is formed of one or more electrically conductive parts, such as one or more metal meshes, foils, plates, or combinations thereof. In some embodiments, the biasing electrode 104 is electrically coupled to a bias compensation module 116, which provides a chucking voltage thereto, such as static DC voltage between about −5000 V and about 5000 V, using an electrical conductor, such as the coaxial transmission line 106 (e.g., a coaxial cable). As will be discussed further below, the high voltage module 116 includes bias compensation circuit elements 116A (FIGS. 3A-3B), a DC power supply 155, and a blocking capacitor 153. A bias compensation module blocking capacitor, which is also referred to herein as the blocking capacitor 153, is disposed between the output of a pulsed-voltage waveform generator (PVWG) 150 and the biasing electrode 104.

The biasing electrode 104 is spaced apart from the substrate receiving surface 105A of the substrate support 105, and thus from the substrate 103, by a layer of dielectric material of the substrate support 105. Depending on the type of electrostatic chucking method utilized within the substrate support 105 to retain a substrate 103 during processing, such as a coulombic ESC or a Johnsen-Rahbek ESC, the effective circuit elements used to model the electrical coupling of the biasing electrode 104 to the plasma 101 will vary. In general, a parallel plate like structure is formed by the biasing electrode 104 and the layer of the dielectric material that can typically have an effective capacitance CE of between about 5 nF and about 50 nF. Typically, the layer of dielectric material (e.g., aluminum nitride (AlN), aluminum oxide ($Al_2O_3$), etc.) has a thickness between about 0.1 mm and about 1 mm, such as between about 0.1 mm and about 0.5 mm, for example about 0.3 mm. Herein, the biasing electrode 104 is electrically coupled to the output of the PVWG 150 using the external conductor, such as the transmission line 106, which is disposed within the support shaft 138. In some embodiments, the dielectric material and layer thickness can be selected so that the chuck capacitance $C_{ESC}$ of the layer of dielectric material is between about 5 nF and about 50 nF, such as between about 7 and about 10 nF, for example.

In a more complex model of the Johnsen-Rahbek ESC the circuit model includes the combination of the ESC dielectric material chuck capacitance $C_{ESC}$, ESC dielectric material resistance $R_{CER}$, gap capacitance $C_{abt}$, substrate capacitance $C_{sub}$, and substrate resistance $R_{sub}$ as shown. The gap capacitances $C_{abt}$ will generally account for gas containing spaces above and below a substrate that is positioned on the substrate support 105. It is expected that the gap capacitance $C_{abt}$ has a capacitance in the same range as the chuck capacitance $C_{ESC}$.

In some applications, since the substrate 103 is typically made out of a thin layer of a semiconductor material and/or dielectric material, the substrate 103 can be considered to be electrically a part of the ESC dielectric layer disposed between the biasing electrode 104 and the substrate receiving surface 105A. Thus, in some applications, the chuck capacitance $C_{ESC}$ is approximated by the combined series capacitance of the ESC and the substrate (i.e., substrate capacitance $C_{sub}$). However, in the coulombic chuck case, since the substrate capacitance $C_{sub}$ is typically very large (>10 nF), or the substrate may be conductive (infinite capacitance), the series capacitance is determined primarily by the capacitance $C_{ESC}$. In this case, the effective capacitance CE is effectively equal to the chuck capacitance $C_{ESC}$. In the case of a "Johnsen-Rahbek ESC", the ESC dielectric layer is "leaky", in that it is not a perfect insulator and has some conductivity, since, for example, the dielectric material may be a doped aluminum nitride (AlN) having a permittivity (c) of about 9. However, the effective capacitance of a Johnsen-Rahbek ESC should be similar to a coulombic chuck. In one example, the volume resistivity of the dielectric layer within a Johnsen-Rahbek ESC is less than about $10^{12}$ ohms-cm (Ω-cm), or less than about $10^{10}$ Ω-cm, or even in a range between $10^8$ Ω-cm and $10^{12}$ Ω-cm.

The substrate support assembly 136 further includes an edge control electrode 115 that is positioned below the edge ring 114 and surrounds the biasing electrode 104 so that when biased, due to its position relative to the substrate 103, it can affect or alter a portion of the generated plasma 101 that is at or outside of the edge of the substrate 103. The edge control electrode 115 can be biased by use of a PVWG 150 that is different from the PVWG 150 that is used to bias the biasing electrode 104. In one configuration, a first PV waveform generator 150 of a first PV source assembly 196 is configured to bias the biasing electrode 104, and a second PV waveform generator 150 of a second PV source assembly 197 is configured to bias the edge control electrode 115. In one embodiment, the edge control electrode 115 is positioned within a region of the substrate support 105, as shown in FIG. 1. In general, for processing chambers 100 that are configured to process circular substrates, the edge control electrode 115 is annular in shape, is made from a conductive material and configured to surround at least a portion of the biasing electrode 104, as shown in FIG. 1. In some embodiments, as illustrated in FIG. 1, the edge control electrode 115 includes a conductive mesh, foil or plate that is disposed a similar distance (i.e., Z-direction) from the surface 105A of the substrate support 105 as the biasing electrode 104. Alternately, in some other embodiments, the edge control electrode 115 includes a conductive mesh, foil or plate that is positioned on or within a region of the quartz pipe 110 (not shown), which surrounds at least a portion of the biasing electrode 104 and/or the substrate support 105. In some other embodiments, the edge control electrode 115 is positioned within or is coupled to the edge ring 114, which is disposed adjacent to the substrate support 105. In this configuration, the edge ring 114 is formed from a semiconductor or dielectric material (e.g., AlN, $Al_2O_3$, etc.).

Referring to FIG. 1, the support base 107 is spaced apart from the biasing electrode 104 by a portion of dielectric material. The portion of dielectric material in some configurations is the dielectric material used to form the substrate support 105, and extends from the backside of the substrate support 105 to the biasing electrode 104. The portion of dielectric material of the substrate support 105 has a support base capacitance CCL that is in series with the ESC capacitance CE, as schematically illustrated in FIGS. 3A and 3B. In some embodiments, the thickness of the portion of the dielectric material disposed between the support base 107 and the biasing electrode 104 is greater than the thickness of the dielectric material disposed between the biasing electrode 104 and the substrate 103, wherein the dielectric materials are the same material and/or form part of the substrate support 105. In one example, the portion of a dielectric material of the substrate support 105 (e.g., $Al_2O_3$ or AlN) disposed between support base 107 and the biasing electrode 104 is greater than 1 mm thick, such as between about 1.5 mm and about 20 mm thick.

Generally, a low pressure formed in the processing volume 129 of the processing chamber 100 results in poor thermal conduction between surfaces of hardware components disposed therein, such as between the dielectric material of the substrate support 105 and the substrate 103 disposed on the substrate receiving surface thereof, which reduces the substrate support's effectiveness in heating or cooling the substrate 103. Therefore, in some processes, a thermally conductive inert heat transfer gas, typically helium, is introduced into a volume (not shown) disposed between a non-device side surface of the substrate 103 and the substrate receiving surface 105A of the substrate support 105 to improve the heat transfer therebetween. The heat transfer gas, provided by a heat transfer gas source (not shown), flows to the backside volume through a gas communication path (not shown) disposed through the support base 107 and further disposed through the substrate support 105.

The processing chamber 100 further includes a controller 126, which is also referred to herein as a processing chamber controller. The controller 126 herein includes a central processing unit (CPU) 133, a memory 134, and support circuits 135. The controller 126 is used to control the process sequence used to process the substrate 103 including the substrate biasing methods described herein. The CPU 133 is a general-purpose computer processor configured for use in an industrial setting for controlling processing chamber and sub-processors related thereto. The memory 134 described herein, which is generally non-volatile memory, may include random access memory, read only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the controller 126 determines which tasks are performable by the components in the processing chamber 100. Preferably, the program, which is readable by CPU 133 in the controller 126, includes code, which, when executed by the processor (CPU 133), performs tasks relating to the monitoring and execution of the electrode biasing scheme described herein. The program will include instructions that are used to control the various hardware and electrical components within the processing chamber 100 to perform the various process tasks and various process sequences used to implement the electrode biasing scheme described herein.

During processing, the PV generators 314 within the PV waveform generators 150 of the first PV source assembly 196 and the second PV source assembly 197 establishes a pulsed voltage waveform on a load (e.g., the complex load 130) disposed with the processing chamber 100. While not intending to be limiting as to the disclosure provided herein, and to simplify the discussion, the components within the second PV source assembly 197, which are used to bias the edge control electrode 115, are not schematically shown in FIGS. 3A-3B. The overall control of the delivery of the PV waveform from each of the PV waveform generators 150 is controlled by use of signals provided from the controller 126. In one embodiment, as illustrated in FIG. 3A, the PV waveform generator 150A is configured to maintain a predetermined, substantially constant positive voltage across its output (i.e., to ground) during regularly recurring time intervals of a predetermined length, by repeatedly closing and opening its internal switch $S_1$ at a predetermined rate. Alternately, in one embodiment, as illustrated in FIG. 3B, a PV waveform generator 150B maintains a predetermined, substantially constant negative voltage across its output (i.e., to ground) during regularly recurring time intervals of a predetermined length, by repeatedly closing and opening its internal switch $S_1$ at a predetermined rate. In FIGS. 3A-3B, the PV waveform generator 150A, 150B is reduced to a minimal combination of the components that are important for understanding of its role in establishing a desired pulsed voltage waveform at the biasing electrode 104. Each PV waveform generator 150 will include a PV generator 314 (e.g., DC power supply) and one or more electrical components, such as high repetition rate switches, capacitors (not shown), inductors (not shown), fly back diodes (not shown), power transistors (not shown) and/or resistors (not shown), that are configured to provide a PV waveform to an output 350, as schematically illustrated in FIGS. 3A-3B. An actual PV waveform generator 150, which can be configured as a nanosecond pulse generator, may include any number of internal components and may be based on a more complex electrical circuit than what is illustrated in FIGS. 3A-3B.

The schematic diagrams of FIGS. 3A-3B each provide only a functionally equivalent representation of the components of the PV waveform generator 150 and its electrical circuitry, in as much as is required to explain the fundamental principle of its operation, its interaction with the plasma in the processing volume, and its role in establishing a pulsed voltage waveform, such as the input pulsed voltage waveform at the biasing electrode 104. As can be inferred from a schematic diagram shown in FIGS. 3A-3B, when the switch $S_1$ moves from the open (Off) to the closed (On) position, it connects the output of the PV waveform generator 150 to its PV generator 314 that produces a substantially constant output voltage. The PV waveform generator 150 may be primarily used as a charge injector (current source), and not as a constant voltage source; therefore it is not necessary to impose stringent requirements on the stability of the output voltage, in that it can vary in time even when the switch remains in the closed (On) position. Further, in some configurations, the PV generator 314 is fundamentally a sourcing, but not a sinking supply, in that it only passes a current in one direction (e.g., the output can charge, but not discharge a capacitor). Additionally, when the switch $S_1$ remains in the open (Off) position, the voltage (Vo), across the output of the PV waveform generator 150 is not controlled by the PV generator 314 and is instead determined by the interaction of its internal components with other circuit elements.

A current-return output stage 314A has one end connected to ground, and another end connected to a connection point (i.e., one side of a generator coupling assembly (not shown)) at the output of the PV waveform generator 150. The current-return output stage 314A can include the following elements: a resistor, a resistor and an inductor connected in series, a switch $S_2$, and/or a more complex combination of electrical elements, including parallel capacitors, which permits a positive current flow towards the ground.

Transmission line 131, which forms part of the PV transmission line 157 (FIG. 1), electrically connects the output 350 of the PV waveform generator 150 to the second filter assembly 151. While the discussion below primarily discusses the PV transmission line 157 of the first PV source assembly 196, which is used to couple a PV waveform generator 150 to the biasing electrode 104, the PV transmission line 158 of the second PV source assembly 197, which couples a PV waveform generator 150 to the edge control electrode 115, will include the same or similar components. Therefore, in general, the output 350 of the PV waveform generator 150 is the end, where the output of the PV pulse generator 314 is connected through the internal electrical conductor to the output 350 and to the current-return output stage 314A. The transmission line 131 connects a generator coupling assembly 181, which is positioned at the output 350 of the PV waveform generator 150, to the second filter assembly 151. The electrical conductor(s) within the various parts of the PV transmission line 157, 158 may include: (a) a coaxial transmission line (e.g., coaxial line 106), which may include a flexible coaxial cable that is connected in series with a rigid coaxial transmission line, (b) an insulated high-voltage corona-resistant hookup wire, (c) a bare wire, (d) a metal rod, (e) an electrical connector, or (f) any combination of electrical elements in (a)-(e). The external conductor portion (e.g., first electrical conductor) of the PV transmission line 157, such as the portion of PV transmission line 157 within the support shaft 138 and the biasing electrode 104, will have some combined stray capacitance $C_{stray}$ (FIGS. 3A-3B) to ground. While not shown in the figures, the external conductor portion (e.g., second electrical conductor) of the PV transmission line 158 and the edge control electrode 115 will also have some combined stray capacitance $C_{stray}$ to ground. The internal electrical conductor of the PV waveform generator 150 may include the same basic elements as the external electrical conductor. In most practical applications, the transmission line 131 will include a line inductance 159 which can include a portion that is created by the internal components of the PV waveform generator 150 (i.e., left side of the generator output coupling assembly 181 (FIGS. 3A-3B)) and/or a portion that is created by the external line/cables (i.e., right side of the generator output coupling assembly 181) that connect the PV waveform generator 150 to the second filter assembly 151.

Referring back to FIG. 1, the processing chamber 100 includes a chamber lid 123 that is grounded. In this configuration, which is generally different from conventional plasma processing chamber designs, the RF power is instead delivered through the substrate support. Thus, by coupling the RF generator 118 to the support base 107, the entire body of the ESC, which is functionally part of the cathode assembly, enables the top electrode to be grounded and allows the current-return area to be maximized. For plasma processes that utilize RF power delivery and PV waveform delivery, maximizing the grounded surface area within the plasma processing chamber, and hence the current-return area, minimizes the plasma potential jump during the ESC-recharging/sheath-collapse phase of the PV waveform cycle generated by the output of the PV waveform generator 150, which are discussed further below. Thus, the apparatus and methods provided herein will minimize the power losses to chamber walls and improves the plasma processing efficiency. The RF power and PV pulsed waveform delivery methods described herein also provides certain process benefits as they impact and allow for an improved control of the plasma properties and radical production. However, as noted above, there is a strong capacitive coupling between the support base 107 and the biasing electrode 104 through the ESC ceramic layer as well as between the RF transmission line 167 and PV transmission line 157, so when both types of power are delivered through the substrate support assembly 136 (i.e., cathode assembly), each generator will induce the current through the other, resulting in the power being diverted away from the intended (plasma) load as well as a possible damage to both generators.

In another alternate chamber lid 123 configuration, which can be used with one or more of the other embodiments disclosed herein, the chamber lid 123 (i.e., opposing electrode) is electrically isolated from the one or more sidewalls 122 and is electrically coupled to an RF generator 118 through a plasma generator assembly 160. In this configuration, the chamber lid 123 can be driven by a RF generator 118 to ignite and maintain a processing plasma 101 within the processing volume 129. In one example, a RF generator 118 is configured to provide an RF signal at an RF frequency greater than about 300 kHz to the chamber lid 123, such as between about 300 kHz and 60 MHz, or even a frequency in range from about 2 MHz to about 40 MHz.

Plasma Processing Biasing Schemes and Processes

Figure 2:
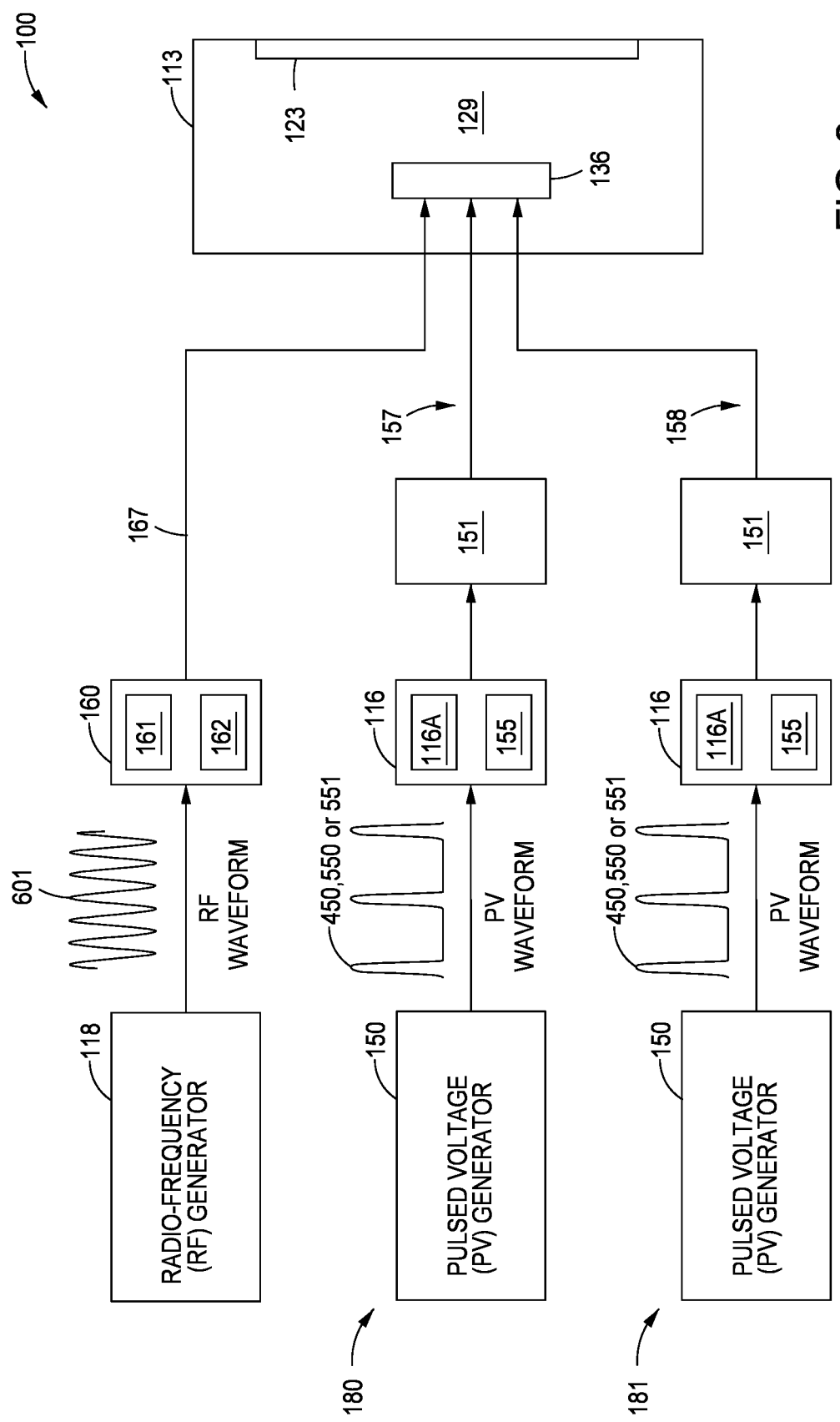
FIG. 2 is a simplified schematic diagram of a biasing scheme that can be used with the process chamber illustrated in FIG. 1, according to one embodiment.

FIG. 2 is a simplified schematic diagram of a biasing scheme that can be used with the process chamber illustrated in FIG. 1. As shown in FIG. 2, the RF generator 118 and PV waveform generators 150 are configured to deliver an RF waveform and pulsed-voltage waveforms, respectively, to one or more electrodes disposed within the chamber body 113 of the processing chamber 100. In one embodiment, the RF generator 118 and PV waveform generators 150 are configured to simultaneously deliver an RF waveform and pulsed-voltage waveform(s) to one or more electrodes disposed within the substrate support assembly 136. In one non-limiting example, as discussed above, the RF generator 118 and a PV waveform generator 150 are configured to deliver an RF waveform and pulsed-voltage waveform to the support base 107 and biasing electrode 104, respectively, which are both disposed in the substrate support assembly 136. In another example, the RF generator 118, a first PV waveform generator 150 and a second PV waveform generator 150 are configured to deliver an RF waveform, a first pulsed-voltage waveform and a second pulsed-voltage waveform to the support base 107, the biasing electrode 104 and the edge control electrode 115, respectively, which are all disposed in the substrate support assembly 136.

As illustrated in FIG. 2, the RF generator 118 is configured to provide a sinusoidal RF waveform to the one or more electrodes disposed in the chamber body 113 by delivering the RF signal, which includes the sinusoidal RF waveform 601 (FIGS. 6A-6G), through the plasma generator assembly 160, which includes the RF matching circuit 161 and the first filter assembly 162. Additionally, each of the PV waveform generators 150 are configured to provide a PV waveform, which typically includes a series of voltage pulses (e.g., nanosecond voltage pulses), to the one or more electrodes disposed in the chamber body 113 by establishing a PV waveform 401 (FIGS. 4A, 5A), 441 (FIG. 5B), or 431 (FIG. 5C) at the biasing electrode 104 through the second filter assembly 151. The components within the bias compensation module 116 can be optionally positioned between each PV waveform generator 150 and the second filter assembly 151.

Figure 4A:
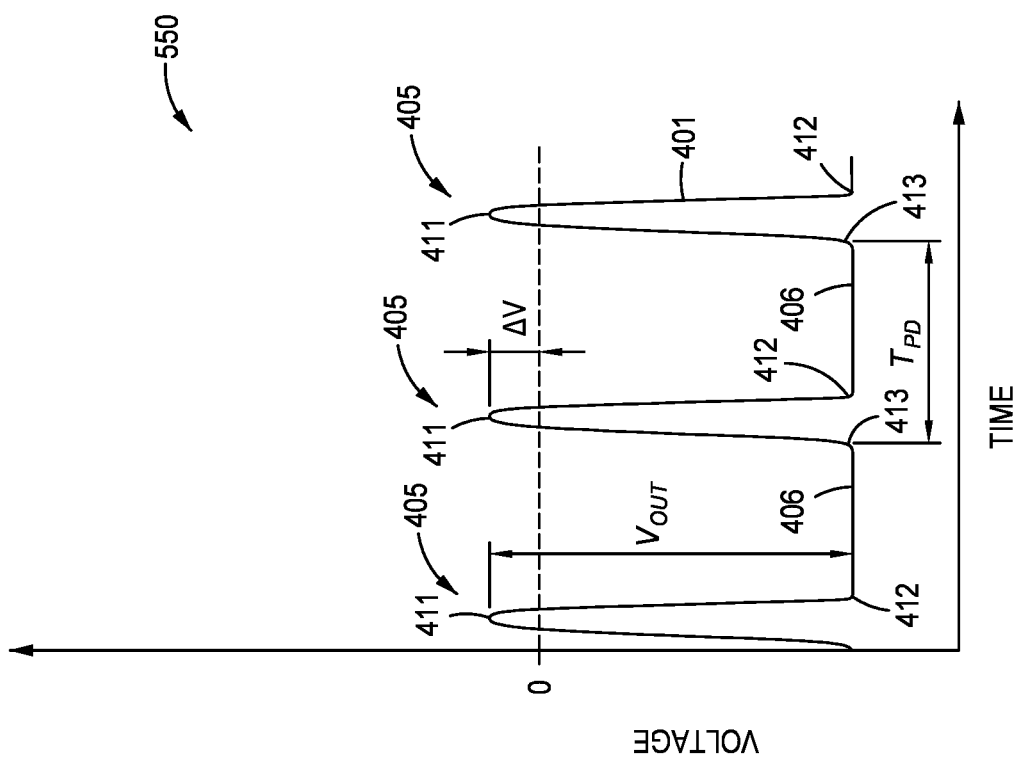
FIG. 4A illustrates an example of a negative pulsed voltage (PV) waveform established at the biasing electrode, according to one embodiment.
Figure 4C:
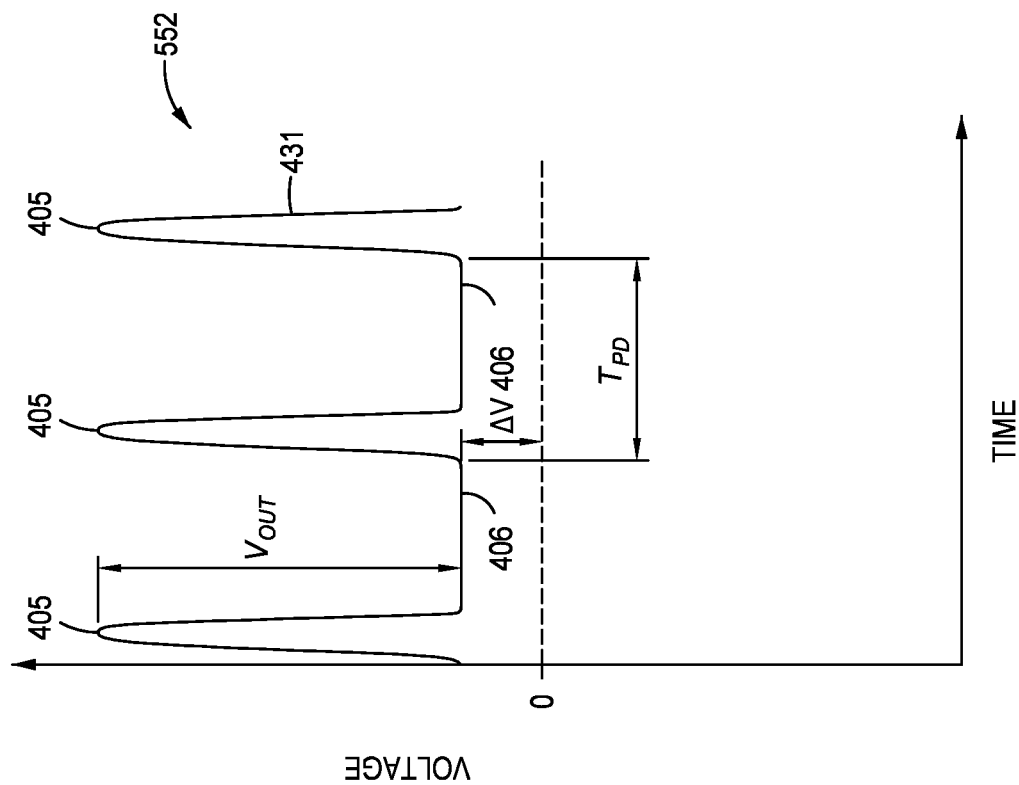
FIG. 4C illustrates an example of a positive pulsed voltage (PV) waveform established at the biasing electrode, according to one embodiment.

As briefly discussed above, FIGS. 3A-3B are each examples of a functionally equivalent, simplified electrical circuit 140 of the pulsed voltage and RF biasing scheme proposed herein, which also includes a representation of the plasma in the process volume. FIG. 3A depicts a simplified electrical circuit 140 of a pulsed voltage and RF biasing scheme that utilizes a PV waveform generator 150, within the first PV source assembly 196, that is configured to provide a positive voltage during a portion of the process of establishing the PV waveform at the biasing electrode 104, such as PV waveform 431 (FIG. 4C). FIG. 3B depicts a simplified electrical circuit 140 of a pulsed voltage and RF biasing scheme that utilizes a PV waveform generator 150, within the first PV source assembly 196, that is configured to provide a negative voltage during a portion of the process of establishing the PV waveform at the biasing electrode 104, such as PV waveform 401 (FIG. 4A). These circuits illustrate a simplified model of the interaction of a pulsed-voltage waveform generator 150 of the first PV source assembly 196 and RF generator 118 within the processing chamber 100, and generally illustrate the basic elements used during operation of the process chamber 100. For clarity purposes, the following definitions are used throughout this disclosure: (1) unless a reference is specified, all potentials are referenced to ground; (2) the voltage at any physical point (like a substrate or a biasing electrode) is likewise defined as the potential of this point with respect to ground (zero potential point); (3) the cathode sheath is implied to be an electron-repelling, ion-accelerating sheath that corresponds to a negative substrate potential with respect to plasma; (4) the sheath voltage (also referred to sometimes as "sheath voltage drop"), $V_{sh}$, is defined as the absolute value of the potential difference between the plasma and the adjacent surface (e.g. of the substrate or the chamber wall); and (5) the substrate potential is the potential at the substrate surface facing the plasma.

The complex load 130 illustrated in FIGS. 3A-3B is shown as a standard electrical plasma model that represents the processing plasma 101 as three series elements. The first element being an electron-repelling cathode sheath (which we sometimes also refer to as the "plasma sheath" or just the "sheath") adjacent to the substrate 103. The cathode sheath is represented in FIGS. 3A-3B by a conventional three-part circuit element comprising: (a) the diode $D_{SH}$, which when open represents the sheath collapse, (b) the current source $I_i$, representing the ion current flowing to the substrate in the presence of the sheath, and (c) the capacitor $C_{SH}$ (e.g., ~100-300 pF), which represents the sheath for the main portion of the biasing cycle (i.e., ion current phase of the PV waveform), during which the ion acceleration and the etching occur. The second element being a bulk plasma, which is represented by a single resistor $R_{plasma}$ (e.g., resistor 146=~5-10 Ohms). The third element being an electron-repelling wall sheath forming at the chamber walls. The wall sheath is likewise represented in FIG. 3 by a three-part circuit element comprising: (a) the diode $D_{wall}$, (b) the current source $I_{iwall}$ representing the ion current to the wall, and (c) the capacitor $C_{wall}$ (e.g., ~5-10 nF), which represents the wall sheath primarily during the ESC recharging phase of the PV waveform (described later in the text). The interior surface of the grounded metal walls can also be considered to be coated with a thin layer of a dielectric material, which is represented in FIG. 3 by a large capacitor $C_{coat}$ (e.g., ~300-1000 nF).

As illustrated in FIG. 3A-3B, the RF generator 118 is configured to provide an RF signal to the support base 107, and eventually the complex load 130, by delivering the generated RF power through the first filter assembly 162, the RF matching circuit 161, line inductance Lune, support base capacitance CCL, and effective capacitance CE. In one embodiment, the RF matching circuit 161 includes a series inductance element $L_{SER}$, and an adjustable series capacitance element $C_{SER}$ and an adjustable shunt capacitance element $C_{Shunt}$ that can be controlled by input from the controller 126. In some embodiments, the RF matching circuit 161 may alternately be formed by use of other circuit element configurations, such as L network, pi network, or transmatch circuits, for example. As noted above, the RF matching circuit 161 is generally configured to tune the apparent load to 50Ω to minimize the reflected power generated by the delivery of the RF signal from the RF generator 118 and maximize its power delivery efficiency. In some embodiments, the RF matching circuit 161 is optional, and in these cases other RF signal matching techniques may be used (e.g., variable frequency tuning) during a plasma processing of a substrate to avoid the inefficient delivering RF power to the complex load 130.

The first filter assembly 162 includes one or more electrical elements that are configured to substantially prevent a current generated by the output of the PV waveform generator 150 from flowing through the RF transmission line 167 and damaging the RF generator 118. The first filter assembly 162 acts as a high impedance (e.g., high Z) to the PV signal generated from the PV pulse generator 314 within the PV waveform generator 150, and thus inhibits the flow of current to the RF generator 118. In one embodiment, the first filter assembly 162 includes a blocking capacitor $C_{BC}$, which is disposed between the RF matching circuit 161 and the RF generator 118. In this configuration, the RF matching element 161 is configured to compensate for the capacitance of the blocking capacitor $C_{BC}$ as it tunes the load apparent to the RF generator 118. In one example, to prevent a nanosecond PV waveform (e.g., pulse period 10-100 ns) provided from the PV waveform generator 150 from damaging the RF generator 118 the first filter assembly 162 includes a 38-40 pF capacitor. In another example, the first filter assembly 162 includes a blocking capacitor $C_{BC}$ that has a capacitance that is less than 38 pF.

In some embodiments, as shown in FIGS. 1-3B, each of the PV waveform generators 150 are configured to provide a pulsed voltage waveform signal to the biasing electrode 104, and eventually the complex load 130, by delivering the generated pulsed voltage waveforms through the blocking capacitor 153 of the high-voltage module 116 and second filter assembly 151, high-voltage line inductance $L_{HV}$, and effective capacitance CE. In this case, the system optionally includes a bias compensation module 116 used for chucking, such as "electrically clamping", the substrate to the substrate receiving surface of the ESC substrate support. Chucking the substrate allows filling a gap between the substrate receiving surface and the non-device side surface of the substrate with helium gas (He), which is done in order to provide good thermal contact between the two and allow substrate temperature control by regulating the temperature of the ESC substrate support. Combining a DC chucking voltage produced by the bias compensation module 116 with the pulsed voltage produced by the PV waveform generator 150 at a biasing electrode 104 will result in an additional voltage offset of the pulsed voltage waveform equal to the DC chucking voltage. The additional voltage offset can be added or subtracted from the offset ΔV illustrated in FIGS. 4A-4B. The effect of the bias compensation module 116 on the operation of the PV pulse generator 314 of the PV waveform generator 150 can be made negligible by selecting appropriately large blocking capacitor 153 and blocking resistor 154. The blocking resistor 154 schematically illustrates a resistor positioned within the components connecting the bias compensation module 116 to a point within the transmission line 131. The value of blocking capacitor 153 is selected such that while blocking only the bias compensation module DC voltage, it does not present any load to the pulsed bias generator's pulsed voltage output. In one example, the capacitance of blocking capacitor $C_{BC}$ is about 38 pF and the capacitance of the blocking capacitor 153 is about 40 nF. This blocking resistor 154 is typically sized to be large enough to efficiently minimize the current through it. For example, a resistance of ≥1 MOhm is used to make a 400 kHz current from the PV waveform generator 150 into the bias compensation module 116 negligible. In one example, the blocking resistor has a resistance of more than about 500 kOhm. The resultant average induced current of the order of 0.5-1 mA is indeed much smaller than a typical limitation for bias compensation module power supplies, which is about 5 mA DC current.

The second filter assembly 151 includes one or more electrical elements that are configured to prevent a current generated by the output of the RF generator 118 from flowing through PV transmission line 157 and damaging the PV pulse generator 314 of the PV waveform generator 150. As discussed above, the PV transmission line 157 is an assembly that includes the coaxial transmission line 106 and transmission line 131. In one embodiment, the second filter assembly 151 includes a filter capacitor 151A, which has a capacitance $C_{FC}$, and a filter inductor 151B, which has an inductance $L_{FL}$, that are connected in parallel, and are disposed in the transmission line 157 between the PV pulse generator 314 and the biasing electrode 104. In some configurations, the second filter assembly 151 is disposed between the blocking capacitor 153 of the bias compensation module 116 and the biasing electrode 104. The second filter assembly 151 acts as a high impedance (e.g., high Z) to the RF signal generated from the RF generator 118, and thus inhibits the flow of current to the PV pulse generator 314. In general, the second filter assembly 151 is configured to block the RF signal, and any associated harmonics from making their way to the PV pulse generator 314. In some embodiments, the RF signal generated by the RF generator is configured to deliver an RF frequency greater than 400 kHz, such an RF frequency MHz, or MHz, or 13.56 MHz, or ≥40 MHz. In one example, to prevent RF power provided from the RF generator 118 at a frequency of 40 MHz from damaging the PV pulse generator 314 the second filter assembly 151 includes a filter capacitor 151A that has a capacitance of about 51 pF and a filter inductor 151B that has an inductance of about 311 nH.

Pulse Waveform Examples

As noted above, embodiments of the disclosure provide novel substrate biasing methods that enable the maintaining of a nearly constant sheath voltage during processing, and thus creating a desired IEDF at the surface of the substrate, while also providing the ability to separately control aspects of the plasma formed in the processing volume of the plasma processing chamber by use of one or more RF source assemblies. In some embodiments, by use of the novel substrate biasing apparatus and methods disclosed herein, a single-peak (mono-energetic) IEDF can be formed at the surface of the substrate during processing. In other embodiments, a two-peak (bi-energetic) IEDF is formed at the surface of the substrate during processing by use of one or more of the novel substrate biasing apparatus and methods disclosed herein.

Figure 4B:
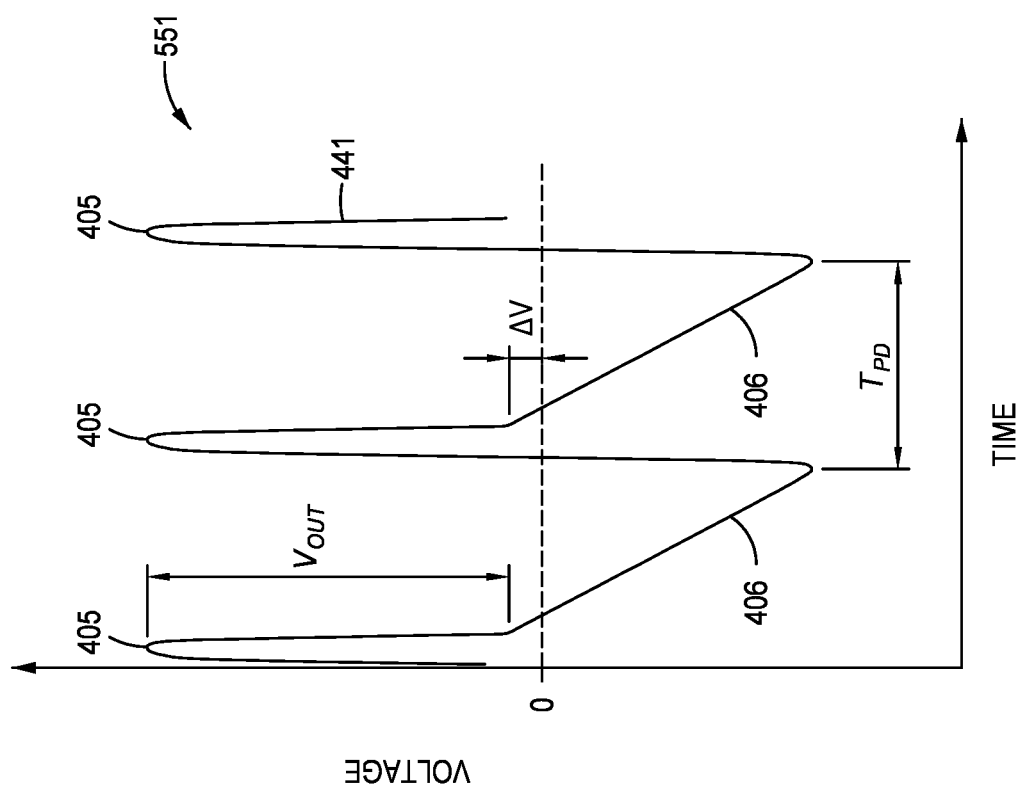
FIG. 4B illustrates an example of a shaped pulsed voltage (PV) waveform established at the biasing electrode, according to one embodiment.

As is discussed further below in relation to FIGS. 4A-4C, the novel substrate biasing methods, which enable the maintaining of a nearly constant sheath voltage during plasma processing, include the delivery of a series of pulses and/or bursts of pulses during a plasma processing sequence performed on a substrate during a plasma process performed in the plasma processing chamber. Embodiments of the disclosure provided herein include the delivery of pulses that have a desired PV waveform, which each include multiple different phases. As is discussed further below, each PV waveform includes at least one phase of the multiple phases that are controlled by the delivery of a voltage signal, or in some cases a constant current signal, provided from the PV waveform generator 150. Generally, for discussion purposes, each pulse of a PV waveform can be segmented into two main regions, which include a first region 405 and a second region 406, as illustrated in FIGS. 4A-4C. In general, each PV waveform will include an amplitude ($V_{out}$), offset (e.g., $\Delta V$), a pulse period ($T_P$), and a pulse repetition frequency ($f_P = 1/T_P$).

In some embodiments, the PV waveform is separately established at the biasing electrode 104 and edge control electrode 115 by use of the PV waveform generator 150 of a first PV source assembly 196 and the PV waveform generator 150 of a second PV source assembly 197, respectively. FIG. 4A illustrates a negative-pulse biasing scheme type of pulsed voltage waveform in which the PV waveform generators 150 are configured to control the generation of a series 550 of multiphase negative pulse waveforms 401 to establish the PV waveform at the biasing electrode 104 or edge control electrode 115. In some embodiments, the multiphase negative pulse waveforms 401 include a series of repeating cycles, such that a waveform within each cycle has a first portion that occurs during a first time interval and a second portion that occurs during a second time interval. The multiphase negative pulse waveforms 401 will also include a positive voltage that is only present during at least a portion of the first time interval, and the pulsed voltage waveform is substantially constant during at least a portion of the second time interval. An output of the PV waveform generator 150 is connected to a negative voltage supply for at least a portion of the second time interval.

Figure 4D:
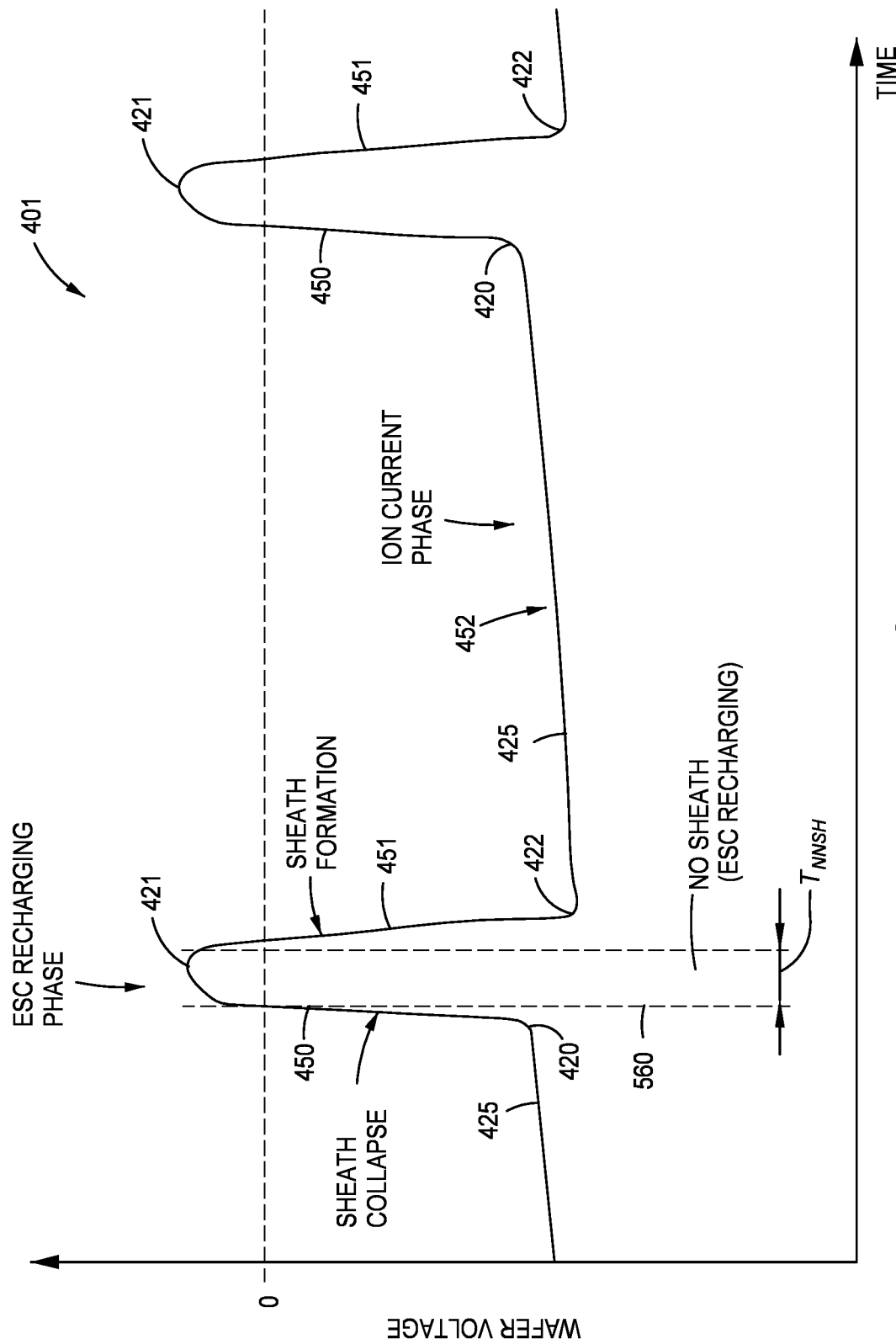
FIG. 4D illustrates a comparison of a negative pulsed voltage (PV) waveform and a positive pulsed voltage (PV) waveform established at a substrate during processing, according to one embodiment.

Referring to FIGS. 4A and 4D, in one example, a substrate PV waveform 425 is a series of PV waveforms established at the substrate due to the established PV waveform formed at the biasing electrode 104 or edge control electrode 115 by a PV waveform generator 150. The substrate PV waveform 425 is established at the surface of a substrate during processing, and includes a sheath collapse and ESC recharging phase 450 (or for simplicity of discussion the sheath collapse phase 450) that extends between point 420 and point 421 of the illustrative substrate PV waveform 425, a sheath formation phase 451 that extends between point 421 and point 422, and an ion current phase 452 that extends between point 422 and back to the start at point 420 of the next sequentially established pulse voltage waveform. The plasma potential curve illustrates the local plasma potential during the delivery of the negative pulse waveforms 401 that are established at the biasing electrode 104 and/or edge control electrode 115 by use of one or more PV waveform generators 150.

In this example, during processing in the processing chamber 100, a multiphase negative pulse waveform 401 (FIG. 4A) is formed when a PV waveform generator 150 supplies and controls the delivery of a negative voltage during two of the phases of the established multiphase negative pulse waveform 401, such as the portions of the PV waveform that trend in a negative direction and/or are maintained at a negative voltage level (e.g., ion current phase). For example, these negative voltage-containing portions of the negative pulse waveform 401 would, by analogy, relate to the sheath formation phase 451 and the ion current phase 452 for the substrate PV waveform 425. In this case, for a multiphase negative pulse waveform 401, the delivery of a negative voltage from a PV waveform generator 150 occurs during the second phase 406, which extends from or between the point 411 (i.e., peak of multiphase negative pulse waveform 401) and the start of the sheath collapse phase 450 of the substrate PV waveform that coincides with point 413. In some embodiments, during the ion current phase 452, which coincides with the portion of the established multiphase negative pulse waveform 401 that is between points 412 and 413, the PV waveform generator 150 is configured to provide a constant negative voltage (e.g., $V_{OUT}$). Due to, for example, the ion current ($I_i$) depositing positive charge on the substrate surface during the ion current phase 452, the voltage at the substrate surface will increase over time, as seen by the positive slope of the line between points 422 and 420. The voltage increase over time at the substrate surface will reduce the sheath voltage and result in a spread of the ion energy. Therefore, it is desirable to control and set at least the PV waveform frequency ($1/T_{PD}$, where $T_{PD}$ is PV waveform period (FIG. 5A)) to minimize the effects of the reduction in the sheath voltage and spread of the ion energy.

By delivering and controlling the PV waveforms provided to the biasing electrode 104 during plasma processing, a desirable ion energy distribution function (IEDF) can be formed, such as a nearly monoenergetic IEDF. The generation and control of the characteristics of the PV waveforms (e.g., peak-to-peak voltage, duty cycle, frequency, etc.) allows for the precise control of the plasma ion density and generated ion energies, and also results in a more controllable fluorinated carbon ($C_xF_y$) based polymer deposition on a conductive material (e.g., W) surface found at the bottom of an etched feature. The formation of the polymer deposition on the conductive material surface will improve the etch selectivity of the dry etch chemistry to the conductive material versus an intervening etched dielectric material.

FIG. 4B illustrates a shaped-pulse biasing scheme type of PV waveform in which the PV waveform generator 150 is configured to control the generation of a series 551 of multiphase shaped pulse waveforms 441 that are established at the biasing electrode 104 and/or edge control electrode 115. In some embodiments, the multiphase shaped pulse waveform 441 is formed by a PV waveform generator 150 that is configured to supply a positive voltage during one or more phases of a voltage pulse (e.g., first region 405) and a negative voltage during one or more phases of the voltage pulse (e.g., second region 406) by use of one or more internal switches and DC power supplies.

In some embodiments, as illustrated in FIG. 4C, the PV waveform generator 150 is configured to provide a series 552 of multiphase positive pulse waveforms 431 to the biasing electrode 104 and edge control electrode 115. Each positive pulse in the positive pulse waveform 431 can include multiple phases, such as a sheath collapse phase, ESC recharging phase, a sheath formation phase and an ion current phase. In this example, the first region 405 generally includes the sheath collapse phase and ESC recharging phase. The second region 406 generally includes the sheath formation phase and the ion current phase. In some embodiments, the multiphase positive pulse waveforms 431 includes a series of repeating cycles, such that a waveform within each cycle has a first portion that occurs during a first time interval and a second portion that occurs during a second time interval. The multiphase positive pulse waveforms 431 will also include a positive voltage that is only present during at least a portion of the first time interval, and the multiphase positive pulse waveforms 431 is substantially constant during at least a portion of the second time interval. An output of the PV waveform generator 150 is connected to a positive voltage supply for at least a portion of a first time interval.

The various pulse voltage waveforms 401, 441 and 431 illustrated in FIGS. 4A, 4B and 4C, respectively, are representative of pulse voltage waveforms that are provided to the input of the bias compensation module 116, and thus may differ from the pulse voltage waveforms that are established at the biasing electrode 104 and edge control electrode 115. The DC offset ΔV found in each PV waveform is dependent on various properties of the PV waveform generator 150 configuration used to establish the PV waveform.

In some embodiments, a series of bursts of at least one or more types of pulse voltage waveforms 401, 441, and/or 431 are established at the biasing electrode 104 and/or edge control electrode 115 and established at the substrate surface. In one example, a plurality of pulses within each burst include a series of negative pulse waveforms 401 that are established at the biasing electrode 104 and/or edge control electrode 115. In one example, each of the bursts of pulse voltage waveforms include pulses that have a waveform that has a consistent pulsed voltage shape (e.g., constant voltage magnitude is provided during a portion of each PV waveform 401), a burst delivery length $T_{ON}$ that may vary from one burst to another over time, and a burst rest length $T_{OFF}$ that may also varying length over time. The burst rest length $T_{OFF}$ is formed by halting the delivery of the PV waveforms provided during the burst delivery length $T_{ON}$ time for a period of time. The duty cycle of the bursts, which is the ratio of the length of time the plurality of pulses are delivered during the burst (i.e., burst delivery length $T_{ON}$) divided by the duration of a burst period (i.e., $T_{BD}=T_{ON}+T_{OFF}$), may be constant or be varied over time. One will appreciate that in other processing methods, the plurality of pulses could include negative pulse waveforms 401, shaped pulse waveforms 441 or positive pulse waveforms 431, or combinations thereof.

Example Selectivity of Etching of Silicon Dioxide

As mentioned previously, plasma etching processes involved in the fabrication of 3D NAND devices are becoming increasingly challenging. Specifically, the staircase contact etch in 3D NAND technology provides access to cells at the bottom of the NAND stack thereby allowing the formed conductive material layers (e.g., tungsten containing layers) buried in the NAND stack to form portions of word-lines that allow access to the cell control gates from the outside peripheral circuitry.

Figure 5:
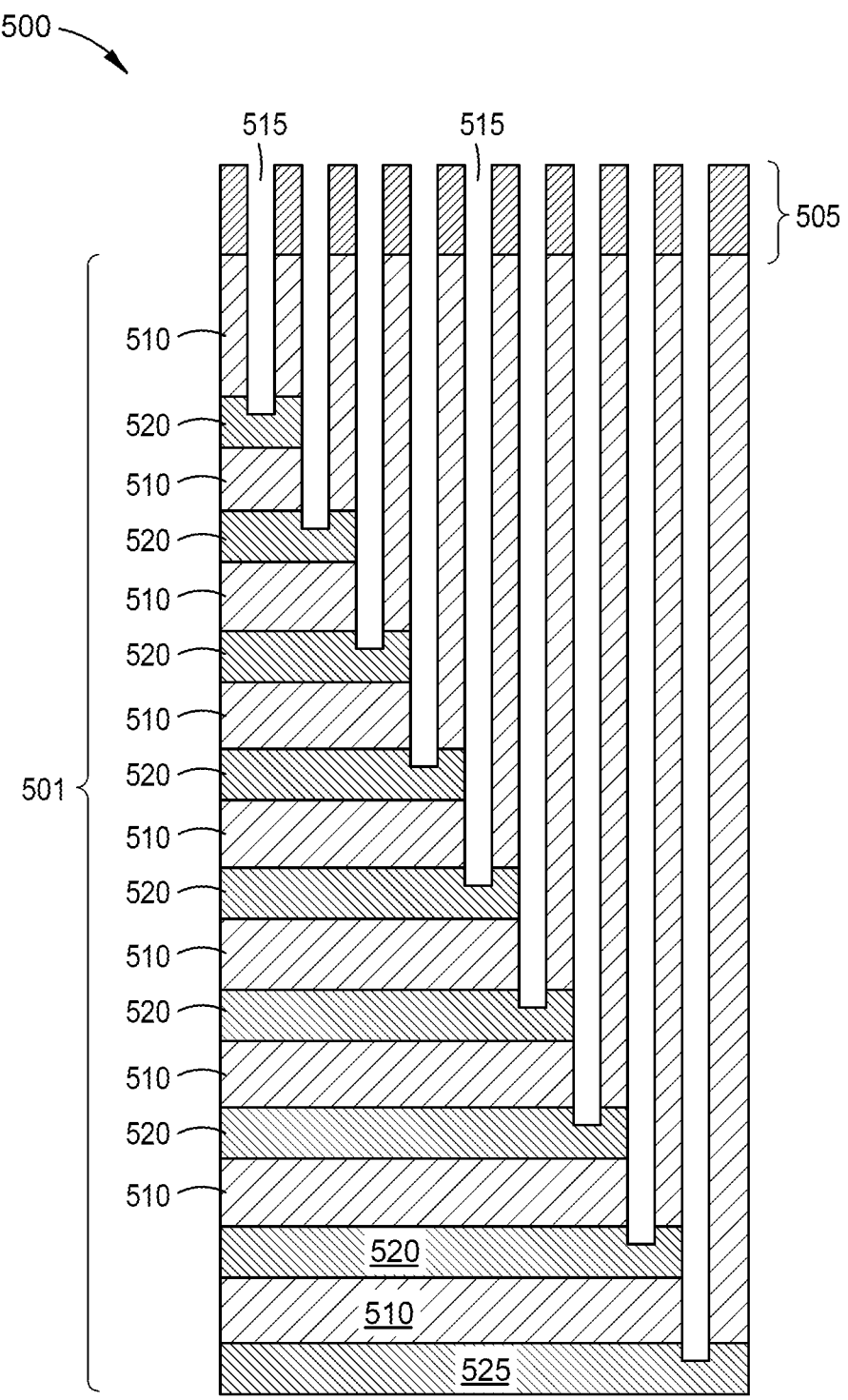
FIG. 5 illustrates a diagram of a substrate with etched trenches reaching to various conductive layers of the substrate, according to one embodiment.

FIG. 5 illustrates the results of a staircase contact etch process performed on a substrate, according to certain embodiments described herein. According to one embodiment, the substrate 500 includes a mask layer 505 and a multilayer stack 501 that includes a plurality of conductive layers 520 and a plurality of intervening dielectric material layers disposed therebetween. The plurality of intervening dielectric material layers and dielectric material disposed adjacent to portions of the conductive layers 520 are collectively described and referred to herein as a dielectric material 510. The mask layer 505 includes a pre-etching pattern that is formed based on customer specifications by use of lithography and mask etch process. The patterned mask layer 505 guides the formation of the features, such as trenches 515, formed during the plasma etching process (as illustrated in FIG. 6A). The multilayer stack 501 includes multiple conductive layers 520, and the conductive layers 520 formed a staggered arrangement so that each of the trenches 515 formed during the plasma etching process described herein reaches each of the conductive layers 520 that are positioned at different depths (Z-direction) within the multilayer stack 501. As illustrated in FIG. 5, each of the trenches 515 formed during the plasma etching process, due to pattern formed in the mask layer 505 have a different depth and contact a different conductive layer 520. Each of the trenches 515 formed during the plasma etching process also do not extend through the corresponding conductive layer 520.

In some embodiments, the conductive layers 520 disposed in the dielectric material 510 of the multilayer stack 501 may be composed of tungsten, platinum, titanium, ruthenium, silicon, molybdenum, cobalt and hafnium.

Figure 6C:
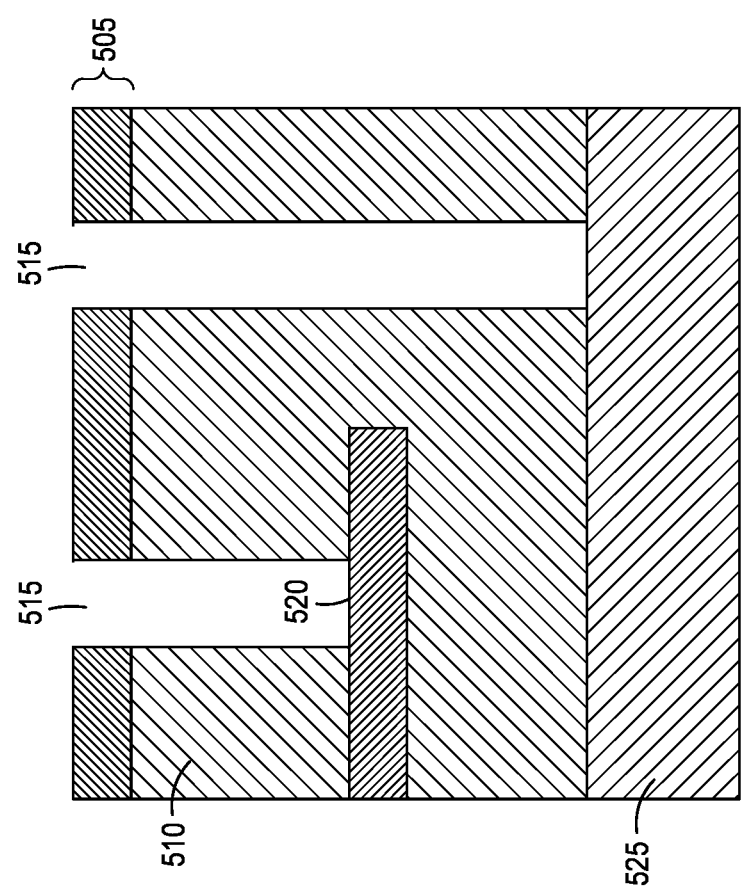

FIGS. 6A-6C each illustrate a portion of a multilayer stack 501 during different phases of a plasma etching process used to form the trenches 515 in a staircase contact structure within a portion of a substrate, according to certain embodiments described herein. FIG. 6A illustrates the substrate with a patterned mask layer 505 formed prior to the plasma etching process used to form trenches 515, which for discussion purposes is referred to herein as a time $T_0$. The pre-etching of the mask layer 505 demarcates where the etching is intended to occur within the dielectric layer 510 during the subsequent plasma etching process.

FIG. 6B illustrates the substrate 500 during the plasma etching process when the plasma process has contacted a conductive layer 520 of the substrate 500. In this example, as shown in FIG. 6B, the plasma etching process has formed two trenches in the dielectric layer 510 due to pattern formed in the mask layer 505. During the plasma etching process, the plasma (e.g., plasma 530 of FIG. 7) formed in the plasma processing chamber interacts with the dielectric material 510 through the patterned mask layer 505, and after a period of time forms the trenches 515 within the dielectric material 510. Because of the composition of the mask layer 505 and the composition of the plasma chemistry, used during the etching process, are selected such that minimal etching will occur during processing, the plasma does not etch the mask layer 505 and only etches the dielectric material 510 exposed through the patterned mask layer 505. Each of the trenches 515 have the same depth at this point in time, which for discussion purposes is referred to herein as a time $T_1$, during the plasma etching process. In some embodiments, the plasma etching process operates in the manner described above.

FIG. 6C illustrates the substrate 500 at the completion of the plasma etching process, which for discussion purposes is referred to herein as a time $T_2$. The plasma etching process continues to etch into the dielectric material 510 within the trenches 515, which were demarcated by the patterned mask layer 505. Because of the composition of the conductive layer 520 and the need for certain compositions of the plasma chemistry to perform the etch process, the conductive layer 520 will experience some undesirable etching while the plasma etching process continues on after the conductive layer 520 is first exposed at time $T_1$ (as illustrated in FIG. 6C). The rate of etching into the conductive layer 520 is much smaller than the rate of etching into the dielectric material 510. Accordingly, the plasma etching process etches into the dielectric material 510 to form trenches in the dielectric material 510 until the plasma 530 reaches one or more conductive layers 520 within the multilayer stack 501 or the base layer 525 of the substrate 500. When the plasma 530 reaches one or more conductive layers 520 or the base layer 525 of the substrate 500, the rate of etching decreases while the rate of etching through the dielectric material 510 stays the same until another conductive layer or the base layer 525 of the substrate 500 is reached.

As mentioned above, the plasma etching process etches into the dielectric material 510 to form trenches in the dielectric material 510 until the plasma 530 reaches one or more conductive layers 520. When the plasma 530 etches through the dielectric material 510 and reaches a conductive layer 520, due to the use of a desirable dry etch chemistry during the plasma etching process, the rate of etching decreases or is inhibited due to a selectivity of the etch chemistry composition to the materials in the conductive layer 520 to the dielectric material 510. As discussed further below, the dry etch chemistry, or process gas, can include a fluorocarbon-containing gas (e.g., $C_xF_y$) and an additional non-fluorocarbon-containing process gas. The interface formed at the surface of the conductive layer 520 may be composed of a polymer material that is formed by the exposure of the dry etch chemistry to the conductive layer material found at the bottom of the etched feature. For example, if the one or more conductive layers 520 is made from tungsten (W), then the plasma etching process forms a polymer material on the surface of the tungsten material, and thus protects the otherwise exposed surface. In some examples, the interface formed is a fluorocarbon-based polymer deposited on the surface of the one or more conductive layers 520 for better protection against plasma radical etching. The interface may be formed on each of the one or more conductive layers 520 that are disposed at different depths within the substrate as the dry etching plasma process progresses. The formation of one or more interfaces on the one or more conductive layers helps with the etching selectivity. That is, the plasma etching process involves selectively etching the dielectric material 510 and avoids etching into the one or more conductive layers 520 by forming an interface on the etched surface of the one or more conductive layers 520. In some examples, the formation of the interface(s) on the one or more conductive layers 520 facilitates etching selectivity of the substrate, such that the plasma 530 (as illustrated in FIG. 7) selectively etches into the dielectric material 510 of the substrate 500 and not into the one or more conductive layers 520 or other underlying materials layers.

Figure 7:
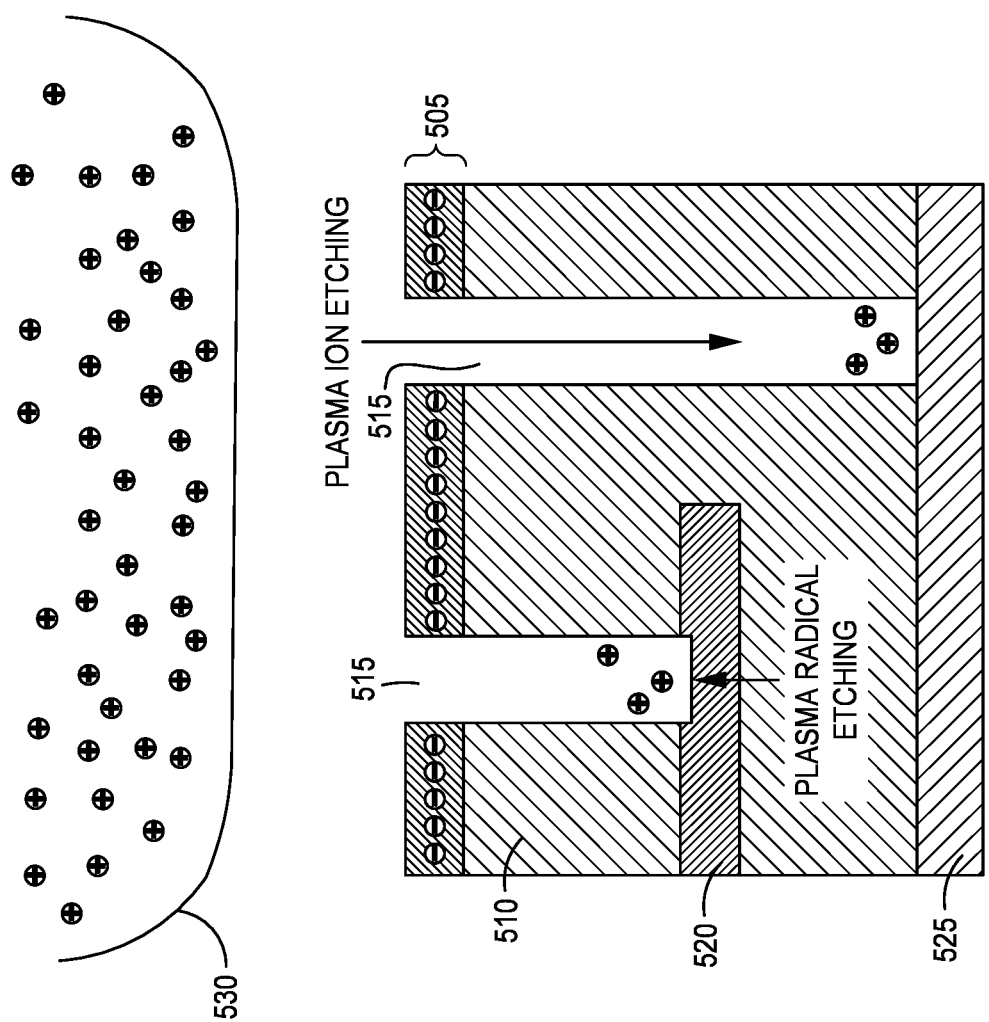
FIG. 7 illustrates a diagram of the plasma etching process on a substrate, according to one embodiment.

FIG. 7 illustrates the enhanced etching selectivity of the plasma etching process, according to one example. During the ESC recharging phase of a PV waveform (e.g., a portion of positive jump within a PV pulse (FIG. 4D)), the sheath thickness of the plasma 530 decreases and the substrate 500 will undergo plasma radical etching, or etching that is primarily caused by radicals versus ions which tends to be more isotropic. During plasma radical etching, fluorocarbon radicals are deposited into the trenches 515 of the substrate 500, and thus the plasma radicals are advantageously used to form a polymer deposition on the surface of the one or more conductive layers 520. Once the ESC recharging phase ends, the sheath of the plasma 530 forms and during the ion current phase (FIG. 4D), the substrate 500 undergoes plasma ion etching, or etching that is primarily caused by ions versus radicals which tends to be more anisotropic.

Figure 8:
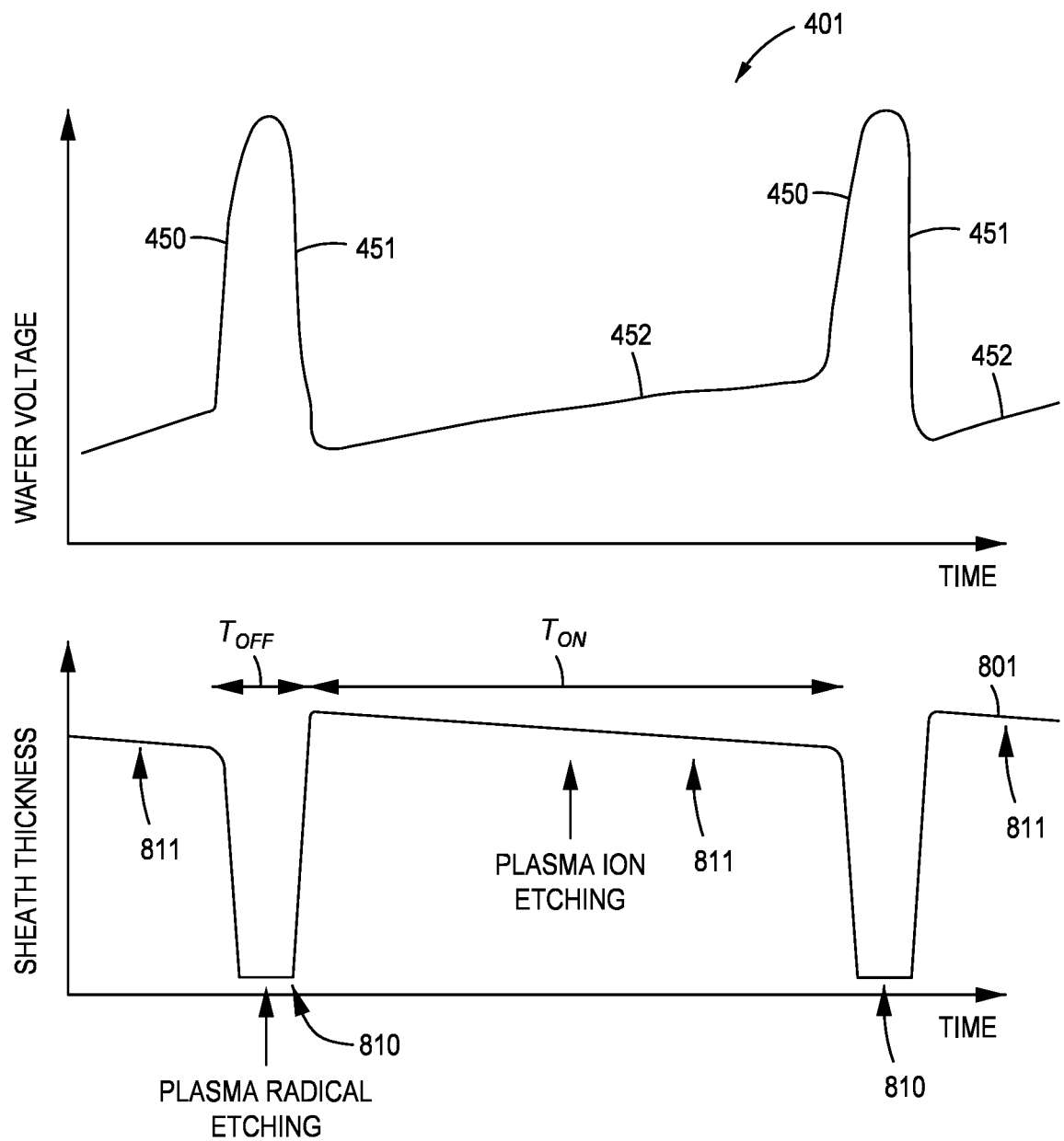
FIG. 8 illustrates example sheath thickness during the plasma etching process, according to one embodiment.

FIG. 8 includes a curve 801 that illustrates a graph of the sheath thickness during the plasma etching process, according to one embodiment. The sheath thickness varies as the PV waveform 401, which is illustrated in FIG. 4D, varies as a function of time. Specifically, during the ESC recharging phase 450, the sheath thickness decreases and the substrate may undergo plasma radical etching, or etching primarily caused by radicals versus ions which tends to be more isotropic. Once the ESC recharging phase 450 ends, the sheath forms during the sheath formation phase 451, and during the ion current phase 452 the substrate undergoes plasma ion etching, or etching that is primarily caused by ions versus radicals which tends to be more anisotropic. During the ion current phase 452, the thickness of the sheath may decrease in line with the increase of wafer voltage during the ion current phase 452.

Figure 9:
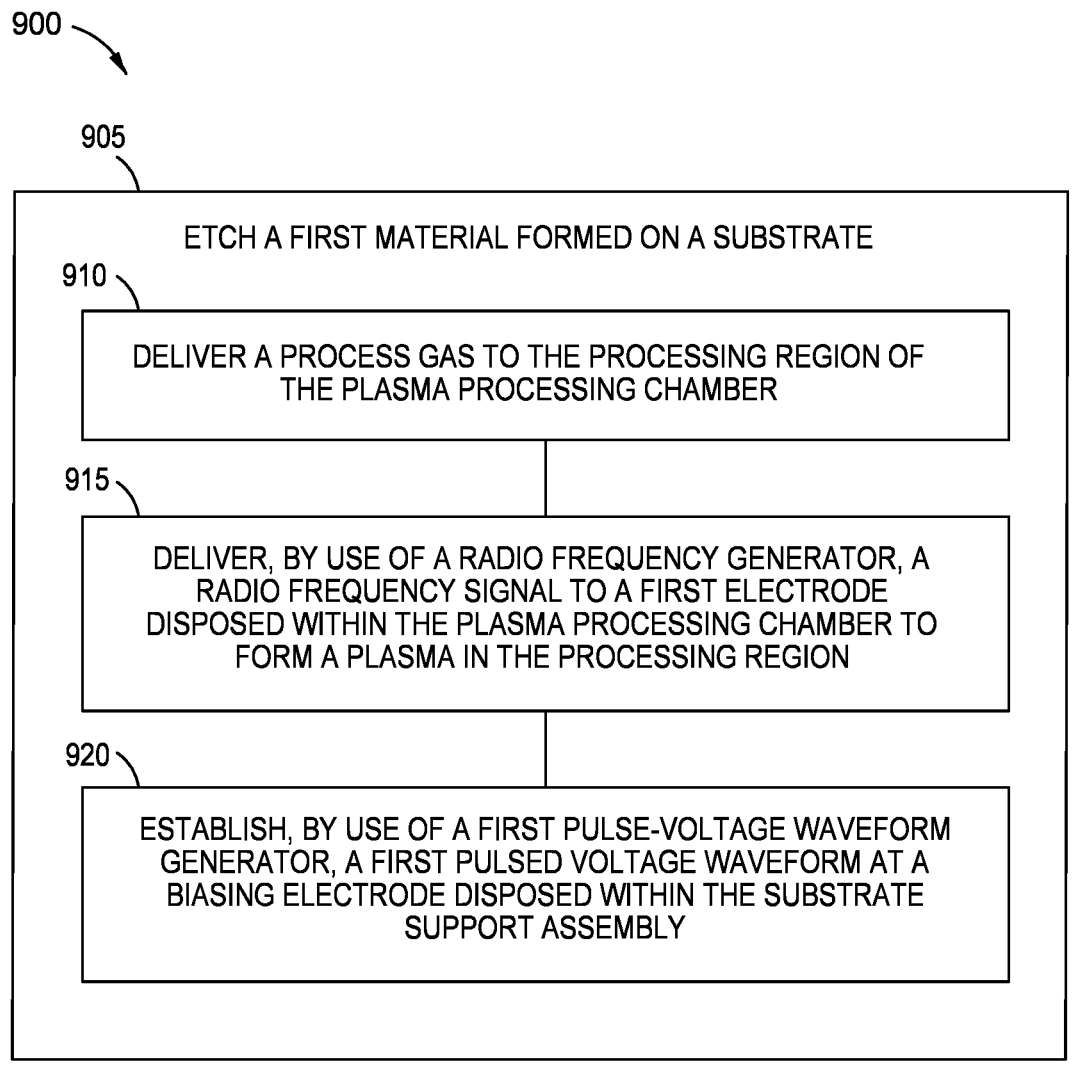
FIG. 9 illustrates example operations of the plasma etching process, according to one embodiment.

FIG. 9 is a flow diagram illustrating example operations 900 for processing a substrate in a plasma processing chamber, in accordance with certain embodiments of the present disclosure. The operations 900 may be performed, for example, in a plasma processing chamber (e.g., such as the plasma processing chamber 100 in FIG. 1).

The operations 900 may begin, at block 905, by positioning substrate, which includes a patterned mask layer and a first dielectric material formed thereon, on a substrate supporting surface of a substrate support assembly disposed within a processing region of the plasma processing chamber. Block 905 generally includes the operations performed in blocks 910-920, which can be performed in any order, but will generally be performed simultaneously for most of the time that block 905 is performed.

At block 910, the plasma etching process involves delivering a dry etch chemistry into the processing region of the plasma processing chamber. The dry etch chemistry may include a first fluorocarbon-containing gas (e.g., $C_xF_y$, such as $C_4F_6$, $C_3F_6$, etc.) and a first process gas. Delivering the dry etch chemistry into the processing region of the plasma processing chamber involves delivering two or more gases selected from including, but are not limited to, $N_2$ gas at a first flow rate, krypton (Kr) gas at a second flowrate, $C_4F_6$ gas at a third flowrate, $C_3F_6$ gas at a fourth flowrate, and $O_2$ gas at a fifth flowrate. The plasma etching process will also include controlling the chamber pressure, substrate support temperature, roof temperatures, and support helium (He) pressure. The first flowrate of $N_2$ may range between 5 sccm to 1000 sccm. The second flow rate of Kr may range between 5 sccm to 1000 sccm. The third flow rate of $C_4F_6$ may range between 5 sccm to 1000 sccm. The fourth flow rate of $C_3F_6$ may range between 5 sccm to 1000 sccm. The fifth flow rate of 02 may range between 5 sccm to 1000 sccm. The plasma etching process will also include controlling the chamber pressure within a range between 1 mT to 500 mT. The plasma etching process will also include controlling the substrate support temperature within a range of between −80 to 500° C. The plasma etching process will also include controlling the roof temperature within a range between 10° C. to 500° C. The plasma etching process may also include controlling the He pressure within a range between 0-100 Torr. In one example, the plasma etching process includes delivering a process gas that has a composition formed by creating a $C_4F_6$ gas flowrate to $C_3F_6$ gas flowrate ratio of about 4, a $C_4F_6$ gas flowrate to $O_2$ gas flowrate ratio of about 2, a $C_4F_6$ gas flowrate to $N_2$ gas flowrate ratio of about 1.1, and a $C_4F_6$ gas flowrate to Kr gas flowrate ratio of about 0.7 at a chamber pressure of between about 1 mTorr and 40 mTorr.

At block 915, the plasma etching process involves delivering, by use of a radio frequency generator, a radio frequency signal to a first electrode disposed within the plasma processing chamber to form a plasma in the processing region. Delivering the radio frequency signal to the first electrode disposed within the plasma processing chamber to form a plasma involves parameters including, but are not limited to: source power and frequency. The RF source power may range between 500 W to 5000 W at a frequency of >400 kHz, such as 2 MHz, or 13.56 MHz, or 40 MHz, or 60 MHz.

At block 920, the plasma etching process involves establishing, by use of a first pulsed-voltage waveform generator, a first pulsed voltage waveform at a biasing electrode within the substrate support assembly. The first pulsed voltage waveform may involve a series of repeating pulsed waveform cycles. Each pulsed waveform cycle includes a first portion that occurs during first time interval (810 in FIG. 8) and a second portion that occurs during a second time interval (811 in FIG. 8), and the second time interval is larger than the first time interval. Each pulsed waveform cycle also includes a peak-to-peak voltage. The pulsed voltage waveform output from the first pulsed-voltage waveform generator is substantially constant during at least a portion of the second time interval. The first time interval of each pulsed waveform cycle may include the sheath collapse phase, the ESC recharging phase, and the sheath formation phase. The second time interval of each pulsed waveform cycle may include the ion current phase. In some examples, the plasma etching process involves plasma radical etching during the first time interval, and plasma ion etching during the second time interval. The plasma etches through dielectric material via plasma ion etching during the second time interval of each pulsed waveform, and the plasma etches into the one or more conductive layers via plasma radical etching during the first time interval of each pulsed waveform.

Delivering the pulsed-voltage waveform to the biasing electrode 104 disposed within the plasma processing chamber involves delivering a pulsed voltage waveform having parameters including, but are not limited to: PVT bias power, duty cycle, pulse frequency, peak-to-peak voltage and flow ratio control (FRC). The bias power may range between 500 W to 500,000 W. The duty cycle may range between 0 to 100%, such as between about 1 and 99%, or even between 5% and 20% for a PV waveform generator 150 that is configured to provide a positive output voltage during the generation of the positive pulse waveforms 431, or a duty cycle of between 50% and 98% for a PV waveform generator 150 that is configured to provide a negative output voltage during the generation of the negative pulse waveforms 401. The pulse frequency may range between 1 to 1000 kHz, such as between about 10 kHz and about 500 kHz, or between about 50 kHz and 400 kHz, or even between about 50 kHz and 200 kHz. The FRC may range between 0 to 100% for all the FRC channel. The peak-to-peak voltage of each of the PV waveforms, generated by the PV waveform generator 150, within a series of PV waveforms is between 0.5 kV and 20 kV, such as between about 2 kV and 20 kV, or between about 5 kV and 9 kV, or between about 5 kV and 8 kV. It has been found that higher peak-to-peak voltages increase the feature etch-rate, and also, surprisingly, improve the selectivity to etching tungsten using the dry etch chemistries, described in operation 910 and the other processing parameters disclosed herein, such as in operations 915 and 920.

The operations 900 may be completed for a desired period of time, or until a desired endpoint is sensed within the plasma processing chamber, so that an etching process can be performed through one or more layers of a multilayer stack, such as the process(es) discussed above in relation to FIGS. 5-6C. In some embodiments, one or more of the software algorithms within the controller 126 are used to monitor, control and/or implement the processes performed within operation 900.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate in a plasma processing chamber, comprising:
    etching a first dielectric material formed on the substrate that is disposed on a substrate supporting surface of a substrate support assembly disposed within a processing region of the plasma processing chamber, the substrate comprising one or more conductive layers, wherein etching the first dielectric material comprises etching one or more trenches through the first dielectric material, wherein a depth of each of the one or more trenches is different and each of the one or more trenches contacts a different conductive layer of the one or more conductive layers relative to one another, wherein etching the first dielectric material comprises:
        delivering a process gas to the processing region of the plasma processing chamber, wherein the process gas comprises a first fluorocarbon containing gas and a first process gas;

delivering, by use of a radio frequency generator, a
radio frequency signal to a first electrode disposed
within the plasma processing chamber to form a
plasma in the processing region; and
establishing, by use of a first pulsed-voltage waveform
generator, a first pulsed voltage waveform at a biasing electrode disposed within the substrate support
assembly, wherein the first pulsed voltage waveform
comprises a series of repeating pulsed waveform
cycles, wherein
each pulsed waveform cycle comprises:
a first portion that occurs during a first time
interval and a second portion that occurs during
a second time interval, wherein the second time
interval is larger than the first time interval; and
a peak-to-peak voltage; and
the first pulsed voltage waveform is substantially
constant during at least a portion of the second
time interval.

2. The method of claim 1, wherein the first time interval is between about 200 ns and about 400 ns.

3. The method of claim 1, wherein the first time interval is less than about 20% of a cycle of the series of repeating cycles.

4. The method of claim 3, wherein the pulsed voltage waveform within each pulsed waveform cycle has a peak-to-peak voltage that is between about 5 kV and 20 kV.

5. The method of claim 1, wherein the process gas comprises a second fluorocarbon containing gas and a second process gas.

6. The method of claim 1 wherein the first fluorocarbon-containing gas comprises at least one of $C_4F_6$ or $C_3F_6$, and the first process gas comprises at least one of $N_2$, Kr, and $O_2$.

7. The method of claim 1, further comprising:
disposing a mask on the substrate;
providing the substrate with the mask within the plasma processing chamber; and
etching the first dielectric material based on a plurality of parameters.

8. The method of claim 1, wherein the one or more conductive layers comprises at least one of tungsten, platinum, titanium, ruthenium, and silicon.

9. The method of claim 1, wherein the one or more conductive layers comprises at least one of molybdenum, cobalt and hafnium.

10. The method of claim 1, wherein each of the one or more trenches does not pass through any of the one or more conductive layers.

11. The method of claim 1, wherein ends of each of the one or more conductive layers are displaced from each other to form a staircase pattern.

12. The method of claim 1, wherein
the delivering of the process gas to the processing region of the plasma processing chamber forms a chamber pressure between 1 mTorr and 500 mTorr, wherein delivering the process gas comprises flowing the first fluorocarbon containing gas at a first flow rate and the first process gas at a second flow rate; and
the pulsed voltage waveform that is established at the biasing electrode disposed comprises a duty cycle that is between 1 and 99%.

13. The method of claim 12, wherein the first fluorocarbon-containing gas comprises at least one of $C_4F_6$ or $C_3F_6$, and the first process gas comprises at least one of $N_2$, Kr, and $O_2$.

14. The method of claim 13, wherein
the series of repeating pulsed waveform cycles are provided at a pulse frequency between about 300 and 500 kHz, and
etching the first dielectric further comprises maintaining a temperature of the substrate support surface in a ranges between −80° C. to 500° C.

15. A method of processing a substrate in a plasma processing chamber, comprising:
disposing a mask on the substrate, the substrate comprising one or more conductive layers;
providing the substrate with the mask on a substrate supporting surface of a substrate support assembly disposed within a processing region of the plasma processing chamber;
etching a first trench through a first dielectric material formed on the substrate until the first trench reaches a first conductive layer of the one or more conductive layers; and
etching a second trench through the first dielectric material past a depth of the first trench until the second trench reaches a second conductive layer of the one or more conductive layers, wherein etching the first trench and the second trench comprises:
delivering a process gas to the processing region of the plasma processing chamber, wherein the process gas comprises a first fluorocarbon containing gas and a first process gas;
delivering, by use of a radio frequency generator, a radio frequency signal to a first electrode disposed within the plasma processing chamber to form a plasma in the processing region; and
establishing, by use of a first pulsed-voltage waveform generator, a first pulsed voltage waveform at a biasing electrode disposed within the substrate support assembly, wherein the first pulsed voltage waveform comprises a series of repeating pulsed waveform cycles, wherein each pulsed waveform cycle comprises:
a first portion that occurs during a first time interval and a second portion that occurs during a second time interval, wherein the second time interval is larger than the first time interval; and
a peak-to-peak voltage, wherein
the first pulsed voltage waveform is substantially constant during at least a portion of the second time interval.

16. The method of claim 15, further comprising,
etching a third trench through the first dielectric material past a depth of the second trench until the third trench reaches a base layer of the substrate.

17. The method of claim 15, wherein etching the second trench comprises etching to a depth matching a depth of the first trench.

* * * * *